United States Patent
Han et al.

(10) Patent No.: US 12,469,425 B2
(45) Date of Patent: Nov. 11, 2025

(54) ARRAY SUBSTRATE AND DISPLAY DEVICE

(71) Applicant: BOE TECHNOLOGY GROUP CO., LTD., Beijing (CN)

(72) Inventors: Long Han, Beijing (CN); Libin Liu, Beijing (CN); Lujiang Huangfu, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 0 days.

(21) Appl. No.: 18/962,357

(22) Filed: Nov. 27, 2024

(65) Prior Publication Data

US 2025/0095535 A1  Mar. 20, 2025

Related U.S. Application Data

(63) Continuation of application No. 18/494,796, filed on Oct. 26, 2023, now Pat. No. 12,198,599, which is a continuation of application No. 17/638,836, filed as application No. PCT/CN2021/075289 on Feb. 4, 2021, now Pat. No. 11,837,142.

(51) Int. Cl.
*G09G 3/20* (2006.01)
*G09G 3/3233* (2016.01)

(52) U.S. Cl.
CPC ......... *G09G 3/2074* (2013.01); *G09G 3/3233* (2013.01); *G09G 2300/0408* (2013.01); *G09G 2300/0426* (2013.01); *G09G 2300/0465* (2013.01); *G09G 2300/0819* (2013.01); *G09G 2310/0202* (2013.01); *G09G 2310/08* (2013.01); *G09G 2320/066* (2013.01)

(58) Field of Classification Search
CPC ............... G09G 3/2074; G09G 3/3233; G09G 2300/0408; G09G 2300/0426; G09G 2300/0465; G09G 2300/0819; G09G 2310/0202; G09G 2310/08; G09G 2320/066

See application file for complete search history.

(56) References Cited

U.S. PATENT DOCUMENTS

2022/0215799 A1* 7/2022 Wang .................. G09G 3/3233
2022/0310751 A1* 9/2022 Shang ................. H10K 59/131

* cited by examiner

*Primary Examiner* — Kenneth B Lee, Jr.
(74) *Attorney, Agent, or Firm* — Calfee, Halter & Griswold LLP

(57) ABSTRACT

The present disclosure relates to an array substrate and a display device. The array substrate includes a plurality of pixel units arranged in an array, each of the pixel units including a plurality of sub-pixels. The array substrate includes: a plurality of power lines which are arranged in a conductive layer on a base substrate, are arranged at intervals along a first direction and extend along a second direction, and are used for providing power signals to the sub-pixels; and a plurality of power leads which are arranged in another conductive layer, are arranged at intervals along the second direction and extend along the first direction. Projections of at least one of the power lines and at least one of the power leads on the base substrate intersect, and the projections of the power lines and the power leads on the base substrate form a grid-like structure.

20 Claims, 27 Drawing Sheets

900

ARRAY SUBSTRATE AND DISPLAY DEVICE

CROSS-REFERENCE TO RELATED APPLICATION(S)

This application is a continuation of U.S. application Ser. No. 18/494,796, filed on Oct. 26, 2023, which is a continuation of U.S. application Ser. No. 17/638,836, filed on Feb. 27, 2022, now U.S. Pat. No. 11,837,142, which is the national stage application under 35 U.S.C. § 371 of International Application No. PCT/CN2021/075289 filed Feb. 4, 2021, the contents of which being incorporated by reference in their entireties herein.

TECHNICAL FIELD

Embodiments of the present disclosure generally relate to the display technical field, and more particularly, to an array substrate and a display device.

BACKGROUND

Organic Light Emitting Diode (OLED) display technology is recognized as the third-generation display technology by the industry due to its advantages of lightness and thinness, self-luminescence, wide viewing angle, fast response speed, low brightness and low power consumption, and OLED has been widely used in the field of high performance display.

As the requirements for the pixel density (PPI) of display panels become increasingly high, the wiring pressure on the panels is also increased. It is needed to consider that various lines can be closely arranged, and to minimize the interferences between various lines. Therefore, higher requirements are placed on the wiring design.

It should be noted that the information disclosed in the Background section is only for enhancement of understanding of the background of the present disclosure, and therefore may contain information that does not form the prior art that is already known to a person of ordinary skill in the art.

SUMMARY

An objective of the present disclosure is to provide an array substrate and a display device.

According to an aspect of the present disclosure, there is provided an array substrate including a plurality of pixel units arranged in an array, each of the pixel units including a plurality of sub-pixels, wherein the array substrate includes:
  a plurality of initialization signal lines which are arranged in a conductive layer, extend along a first direction and are arranged at intervals along a second direction, and are used to provide initialization signals to the sub-pixels, wherein the first direction intersect with the second direction; and
  a plurality of connection lines which are arranged in another conductive layer, extend along the second direction and are arranged at intervals along the first direction;
  wherein projections of at least one of the initialization signal lines and at least one of the connection lines on the base substrate intersect, and the at least one of the initialization signal lines and the at least one of the connection lines are connected through a via hole, so that the projections of the initialization signal lines and the connection lines on the substrate form a grid-like structure.

In an exemplary embodiment of the present disclosure, the array substrate includes the base substrate and a first gate line layer, a second gate line layer, a source and drain layer and an anode layer which are stacked on the base substrate in sequence, the first direction is a row direction, and the second direction is a column direction;
  the plurality of initialization signal lines are arranged in the second gate layer; and
  the plurality of connection lines are arranged in the source and drain layer or the anode layer.

In an exemplary embodiment of the present disclosure, the array substrate further includes:
  a plurality of scan lines which are arranged in the first gate line layer, extend along the row direction and are arranged at intervals along the column direction, and are used providing scan signals to the sub-pixels; and
  a plurality of reset signal lines which are arranged in the first gate line layer, extend along the row direction and are arranged at intervals along the column direction, and are used for providing reset signals to the sub-pixels.

In an exemplary embodiment of the present disclosure, in each sub-pixel area, a projection of a corresponding initialization signal line among the plurality of initialization signal lines on the base substrate is located between a projection of a corresponding reset signal line among the plurality of the plurality of reset signal lines and a projection of a scan line for a previous-stage sub-pixel, and the projection of the corresponding initialization signal line, the projection of the corresponding reset signal line and the projection of the scan line do not overlap with each other.

In an exemplary embodiment of the present disclosure, in each sub-pixel area, a projection of a corresponding initialization signal line among the plurality of initialization signal lines on the base substrate is located at a side of a projection of a corresponding reset signal line among the plurality of the plurality of reset signal lines away from a scan line for a previous-stage sub-pixel, and the projection of the corresponding initialization signal line, the projection of the corresponding reset signal line and the projection of the scan line do not overlap with each other.

In an exemplary embodiment of the present disclosure, in each sub-pixel area, a corresponding reset signal line among the plurality of reset signal lines and a scan line for a previous-stage sub-pixel are connected integrally; and
  a projection of a corresponding initialization signal line among the plurality of initialization signal lines on the base substrate intersects with a projection of the corresponding reset signal line.

In an exemplary embodiment of the present disclosure, each of the initialization signal lines includes a plurality of signal segments separated from each other, and the signal segments corresponds to the pixel units one to one;
  wherein a projection of each of the signal segments has no overlap with a projection of a corresponding reset signal line in at least one of sub-pixel areas in a corresponding pixel unit, and the projection of each of the signal segments intersects with a projection of the corresponding reset signal line in a remaining sub-pixel area in the corresponding pixel unit.

In an exemplary embodiment of the present disclosure, the number of the connection lines is equal to the number of sub-pixels in the row direction, and in the row direction, the initialization signal lines and the connection lines are electrically connected through via holes in individual sub-pixel areas;

or, the number of the connection lines is smaller than the number of sub-pixels in the row direction, and in the row direction, the initialization signal lines and the connection lines are electrically connected through via holes in a part of sub-pixel areas.

In an exemplary embodiment of the present disclosure, the array substrate includes:

a plurality of power lines which are arranged in the source and drain layer, extend along the column direction and arranged at intervals along the row direction, and are used for providing power signals to the sub-pixels; and a plurality of data lines which are arranged in the source and drain layer, extend along the column direction and are arranged at intervals along the row direction, and are used for providing data signals to the sub-pixels.

In an exemplary embodiment of the present disclosure, each of the sub-pixels includes an anode, the connection lines and the anode are both arranged in the anode layer, and the connection lines are insulated from the anode.

In an exemplary embodiment of the present disclosure, the array substrate includes:

a plurality of first conductive connection portions which are arranged in the source and drain layer, and are distributed in sub-pixel areas where projections of the initialization signal lines and the connection lines intersect;

wherein in a sub-pixel area where a first conductive connection portion among the plurality of first conductive connection portions is distributed, a projection of the first conductive connection portion on the base substrate has an overlapping area with a corresponding initialization signal line and a corresponding connection line, respectively, and the first conductive connection portion is connected to the corresponding connection line through a via hole.

In an exemplary embodiment of the present disclosure, the connection lines are arranged in the source and drain layer;

in each sub-pixel area, a corresponding initialization signal line of the plurality of initialization signal lines includes a main body section and an extension section which are connected to each other, the main body section of the corresponding initialization signal line extends along the row direction, and the extension section of the corresponding initialization signal line extends in a direction different from an extending direction of the main body section; and a projection of the extension section of the corresponding initialization signal line on the base substrate overlaps with a projection of a corresponding connection line among the plurality of connection lines, and the extension section of the corresponding initialization signal line and the corresponding connection line are connected through a via hole in the overlapping area.

In an exemplary embodiment of the present disclosure, the array substrate further includes:

a plurality of light-emitting control signal lines which are arranged in the first gate line layer, extend along the row direction and arranged at intervals along the column direction, and are used for providing light-emitting control signals to the sub-pixels;

wherein in each sub-pixel area, a corresponding light-emitting control signal line among the plurality of light-emitting control signals is located on a side of a corresponding reset signal line away from a scan line for a previous-stage sub-pixel, and does not overlap with a projection of a corresponding initialization signal line.

In an exemplary embodiment of the present disclosure, the array substrate further includes:

a plurality of power leads which are arranged in the second gate line layer, extend along the row direction and are arranged at intervals along the column direction, and power lines in a same row are connected to one of the power leads through via holes.

In an exemplary embodiment of the present disclosure, each of the sub-pixels further includes a sub-pixel driving circuit, and the sub-pixel driving circuit includes:

a capacitor including a first electrode plate and a second electrode plate, wherein the first electrode plate is arranged in the first gate line layer, and the second electrode plate is arranged in the second gate line layer;

a driving transistor, wherein the first electrode plate of the capacitor is multiplexed as a gate of the driving transistor, and a first electrode of the driving transistor is connected to a corresponding power line;

a first transistor, wherein a gate of the first transistor is connected to a corresponding scan line, a first electrode of the first transistor is connected to a corresponding data line, and a second electrode of the first transistor is connected to the second electrode plate of the capacitor;

a second transistor, wherein a gate of the second transistor is connected to the corresponding scan line, a first electrode of the second transistor is connected to a second electrode of the driving transistor, and a second electrode of the first transistor is connected to the first electrode plate of the capacitor;

a fourth transistor, wherein a gate of the fourth transistor is connected to a corresponding reset signal line, a first electrode of the fourth transistor is electrically connected to a corresponding initialization signal line, and a second electrode of the fourth transistor is electrically connected to the first electrode plate of the capacitor;

a fifth transistor, wherein a gate of the fifth transistor is connected to the corresponding reset signal line, a first electrode of the fifth transistor is electrically connected to the corresponding initialization signal line, and a second electrode of the fifth transistor is electrically connected to the second electrode plate of the capacitor;

a sixth transistor, wherein a gate of the sixth transistor is connected to a corresponding light-emitting control signal line, a first electrode of the sixth transistor is electrically connected to the corresponding initialization signal line, and a second electrode of the sixth transistor is electrically connected to the second electrode plate of the capacitor;

a seventh transistor, wherein a gate of the seventh transistor is connected to the corresponding light-emitting control signal line, a first electrode of the seventh transistor is electrically connected to the second electrode of the driving transistor, and a second electrode of the seventh transistor is electrically connected to the anode of the sub-pixel;

an eighth transistor, wherein a gate of the eighth transistor is connected to the corresponding reset signal line, a first electrode of the eighth transistor is electrically connected to the corresponding initialization signal line, and a second electrode of the eighth transistor is electrically connected to the anode of the sub-pixel; and a ninth transistor, wherein a gate of the ninth transistor is connected to the corresponding light-emitting control signal line, and a first electrode of the ninth transistor is electrically connected to the first electrode plate of the capacitor.

In an exemplary embodiment of the present disclosure, the array substrate further includes:

a plurality of second conductive connection portions arranged in the source and drain layer and distributed in sub-pixel areas;

a plurality of third conductive connection portions arranged in the source and drain layer and distributed in the sub-pixel areas;

wherein in each of the sub-pixel areas, a corresponding second conductive connection portion among the plurality of second conductive connection portions is connected with the second electrode of the first transistor, the second electrode of the fifth transistor, the second electrode of the sixth transistor, and the second electrode plate of the capacitor through via holes, and the second electrode of the first transistor, the second electrode of the fifth transistor and the second electrode of the sixth transistor are all electrically connected to the second electrode plate of the capacitor through the corresponding second conductive connection portion;

wherein in each of the sub-pixel areas, a corresponding third conductive connection portion among the plurality of third conductive connection portions is connected with the second electrode of the fourth transistor, the first electrode of the ninth transistor and the first electrode plate of the capacitor through via holes, and the second electrode of the four transistor and the first electrode of the ninth transistor are all electrically connected to the first electrode plate of the capacitor through the corresponding third conductive connection portion.

In an exemplary embodiment of the present disclosure, the array substrate further includes:

a plurality of fifth conductive connection portions arranged in the source and drain layer and distributed in each of the sub-pixel areas;

wherein a corresponding fifth conductive connection portion among the fifth conductive connection portions is connected to the first electrode of the fifth transistor through a via hole, and the corresponding fifth conductive connection portion is further connected to the corresponding initialization signal line through another via hole, so that the first electrode of the fifth transistor is connected to the corresponding initialization signal line;

wherein the connection lines are arranged in the source and drain layer, and a connection line among the connection lines is connected to the corresponding fifth conductive connection portion so as to be connected to the corresponding initialization signal line through the corresponding fifth conductive connection portion.

According to another aspect of the present disclosure, there is provided a display device, including the array substrate described above.

It is to be understood that the foregoing general description and the following detailed description are exemplary and explanatory only and are not restrictive of the present disclosure.

BRIEF DESCRIPTION OF THE DRAWINGS

The accompanying drawings, which are incorporated in and constitute a part of the description, illustrate embodiments consistent with the disclosure and serve to explain principles of the disclosure together with the description. Obviously, the drawings in the following description are only some embodiments of the present disclosure, and for those of ordinary skill in the art, other drawings can be obtained from these drawings without creative effort.

Figure 1:
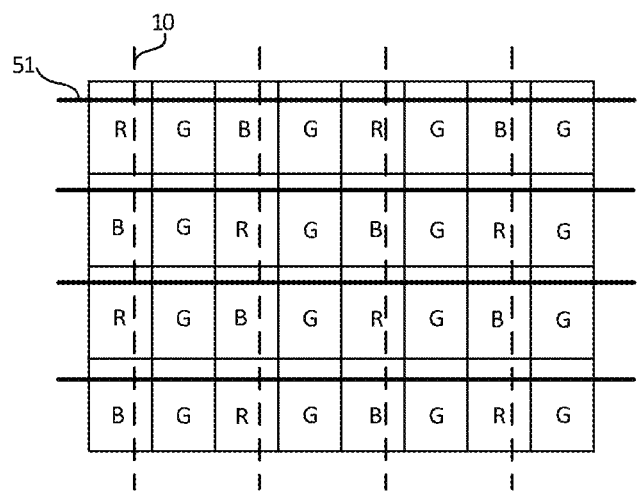
FIG. 1 is a schematic diagram of a positional relationship between initialization signal lines and connection lines according to an embodiment.

Listing of main reference numbers:
- 100: active layer; 200: first gate insulating layer; 300: first gate line layer; 400: second gate insulating layer; 500: second gate line layer; 500': second gate line layer; 600: dielectric layer; 700: source and drain layer; 700': source and drain layer; 800: passivation layer; 900: anode layer;
- 31: scan line; 32: reset signal line; 33: light-emitting control signal line; 51: initialization signal line; 510: signal segment; 511: main body section; 512: extension section; 52: power lead; 71: data line; 72: power line; 73: first conductive connection portion; 74: second conductive connection portion; 75: third conductive connection portion; 76: fourth conductive connection portion; 77: fifth conductive connection portion; 80: via hole; 91: anode; 10: connection line.

DETAILED DESCRIPTION

Example embodiments will now be described more fully with reference to the accompanying drawings. However, the embodiments can be implemented in a variety of forms and should not be construed as being limited to the examples set forth herein; rather, these embodiments are provided so that the present disclosure will be more complete so as to convey the idea of the exemplary embodiments to those skilled in this art. The same reference signs in the drawings indicate the same or similar structures, and thus their repeated descriptions will be omitted. In addition, the drawings are only schematic illustrations of embodiments of the present disclosure, and are not necessarily drawn to scale.

Although relative terms such as "upper" and "lower" are used in this specification to describe relative relationships between one component in a figure and another component, these terms are used only for convenience, for example, these terms are based on the directions shown in the drawings. It can be understood that if a device shown in a figure is turned upside down, a component described as "upper" will become a "lower" component. When a structure is "on" another structure, it may mean that the structure is integrally formed on another structure, or that the structure is "directly" arranged on another structure, or that the structure is "indirectly" arranged on another structure through a further structure.

The terms "a", "an", "the", "said" and "at least one" are used to indicate the presence of one or more elements/components/etc.; the terms "include" and "have" are open terms and means inclusive, and refers to that in addition to the listed elements/components and so on, there may be other elements/components and so on. The terms "first", "second" and "third" etc. are used only as markers and are not intended to limit the number of associated objects.

An embodiment of the present disclosure provides an array substrate. Referring to FIG. 1, the array substrate includes a plurality of pixel units which are arranged in an array along a row direction and a column direction. Each pixel unit includes a plurality of sub-pixels. The array substrate includes a plurality of initialization signal lines 51 and a plurality of connection lines 10. Taking a situation where the first direction is the row direction and the second direction is the column direction in the figure as an example, the plurality of initialization signal lines 51 are provided in a conductive layer, extend along the row direction and are arranged at intervals along the column direction. Each initialization signal line 51 is used for providing an initialization signal sub-pixels located in the same corresponding row in the row direction. The plurality of connection lines 10 are arranged in another conductive layer, extend along the column direction and are arranged at intervals along the row direction. Projections of at least one initialization signal line 51 and at least one connection line 10 on the base substrate intersect with each other, and the at least one initialization signal line 51 and at least one connection line 10 are connected through a via hole, so that the projections of the initialization signal line 51 and the connection line 10 on the base substrate intersect to form a grid-like structure.

The horizontal initialization signal lines 51 are connected into a grid-like structure through the vertical connection lines 10, and the paths for the initialization signals are increased, and the initialization signals can be transmitted to the sub-pixels through more paths, thereby reducing an overlarge IR drop caused by single current transmission path. Compared with wiring in one layer, the entire grid structure is divided into two wiring layers, which can reduce pressure on wiring space, ease the problem that the initialization signals are prone to be influenced by jump of other signals (such as scan signal) due to over compactness of single-layer wiring, and thus reduce influence on the light-emitting performance and improve the display uniformity of the panel.

It should be noted that the horizontal arrangement of the initialization signal lines 51 means that the main structure of the initialization signal lines 51 extends horizontally. In actual products, there may be some parts that are not completely horizontally arranged, for example, some parts may make a turn to avoid other circuit structures, or may extend to other directions to facilitate connection with other lines, and so on, as long as the overall orientation of the initialization signal lines 51 is the lateral direction. Similarly, the vertical arrangement of the connection lines 10 means that the main structure of the connection lines 10 extends in the vertical direction and the overall orientation is the vertical direction.

The array substrate according to embodiments will be described in detail below.

In an embodiment, each pixel unit is composed of four sub-pixels, i.e., RGBG, and each sub-pixel is driven by a separate sub-pixel driving circuit.

Figure 2:
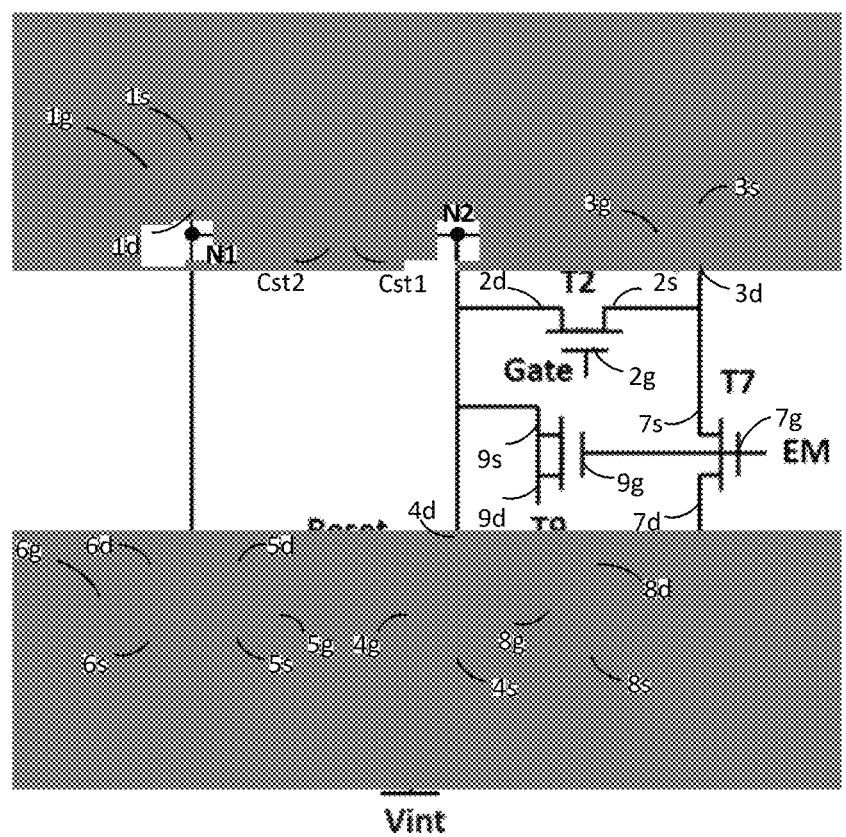
FIG. 2 is a schematic structural diagram of a 9T1C sub-pixel circuit.

FIG. 2 shows a 9T1C sub-pixel circuit structure. The sub-pixel circuit structure includes one capacitor and nine Thin Film Transistor (TFT) transistors T1 to T9. In an embodiment, all TFTs are P-type TFTs, and the third transistor T3 is a driving transistor, other transistors are switching transistors.

Referring to FIG. 2, the capacitor includes a first electrode plate Cst1 and a second electrode plate Cst2. The first electrode plate Cst1 is provided in a first gate line layer 300, and the second electrode plate Cst2 is provided in a second gate line layer 500. The first plate Cst1 is connected to a node N2, and the second plate Cst2 is connected to a node N1. A gate 3g of the driving transistor T3 (third transistor) is multiplexed by the first plate Cst1 of the capacitor, and a source 3s is connected to a power line 72. A gate 1g of the first transistor T1 is connected to a scan line 31, a source 1s is connected to the power line 72, and a drain 1d is connected to the node N1. A gate 2g of the second transistor T2 is connected to the scan line 31, a source 2s is connected to a drain 3d of the driving transistor T3, and a drain 2d is connected to the node N2. A gate 4g of the fourth transistor T4 is connected to a reset signal line 32, a source 4s is electrically connected to an initialization signal line 51, and a drain 4d is connected to the node N2. A gate 5g of the fifth transistor T5 is connected to the reset signal line 32, a source 5s is electrically connected to the initialization signal line 51, and a drain 5d is connected to the node N1. A gate 6g of the sixth transistor T6 is connected to a light-emitting control signal line 33, a source 6s is electrically connected to the initialization signal line 51, and a drain 6d is connected to the node N1. A gate 7g of the seventh transistor T7 is connected to the light-emitting control signal line 33, a source 7s is electrically connected to the drain 3d of the driving transistor T3, and a drain 7d is electrically connected to an anode 91 of the sub-pixel. A gate 8g of the eighth transistor T8 is connected to the reset signal line 32, a source 8s is electrically connected to the initialization signal line 51, and a drain 8d is electrically connected to the anode 91 of the sub-pixel. A gate 9g of the ninth transistor T9 is connected to the light-emitting control signal line 33, and a source 9s is connected to the node N2.

The initialization signal provided by the initialization signal line 51 is Vint, the reset signal provided by the reset signal line 32 is Reset, the light-emitting control signal provided by the light-emitting control signal line 33 is EM, the scan signal provided by the scan line 31 is gate, and the data line 71 The data signal provided is data, and the power signal provided by the power line 72 is ELVDD.

Figure 3:
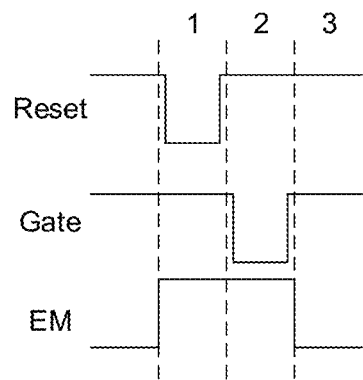
FIG. 3 is a timing diagram of the sub-pixel circuit structure shown in FIG. 2.

Referring to the timing diagram shown in FIG. 3, the specific working principle of the sub-pixel compensation circuit is as follows.

In a first stage, the reset signal Reset is at a low level. The fourth transistor T4 is turned on, and the initialization signal Vint initializes the node N2. At this time, the potential of the node N2 is the initialization signal Vint. The fifth transistor T5 is turned on, and the initialization signal Vint is written into the node N1. The eighth transistor T8 is turned on to release the residual charge displayed in a previous frame, and the initialization signal Vint is written to reduce the voltage difference between the anode and cathode of the OLED device, reduce the brightness of the OLED device at low gray levels, and improve the contrast of the pixel.

In a second stage, the signal Gate of the scan line 31 is at a low level. The first transistor T1 is turned on, and at this time the potential of the node N1 is Vdata, and the data signal voltage is written into the node N1. The second transistor T2 is turned on, and the diode connection of the driving transistor T3 is sampled, and the potential of the node N2 rises to ELVDD+Vth, the driving transistor T3 gradually changes from the on state to the off state, to compensate the threshold voltage Vth of the driving transistor T3.

In a third stage, the light-emitting control signal EM is at a low level. The sixth transistor T6 is turned on, and at this time the potential of the node N1 is the initialization signal Vint. The ninth transistor T9 is turned on, and the leakage of the node N2 is reduced in the light-emitting stage. As the potential of the node N1 jumps, the potential of the node N2 becomes ELVDD+Vth+Vint-Vdata at this time. The seventh transistor T7 is turned on, the driving current is output, and the OLED device emits light. The current calculation formula of the OLED device is:

$$I_{on} = \frac{1}{2} K \cdot (V_{gs} - |V_{th}|)^2 = \frac{\mu W C_{ox}}{2L} \times (V_{int} - V_{data})^2$$

By the above circuit, the threshold voltage Vth of the driving transistor T3 can be compensated in the sampling stage, thereby eliminating the influence of differences of the DTFT threshold voltage Vth of different pixels on the uniformity of display brightness.

In an embodiment, Vint may be used as an initialization signal, and can also be used as a reference signal during data writing.

In an embodiment, the sub-pixel driving circuits of the above-mentioned sub-pixels are fabricated on a base substrate. An active layer 100, a first gate line layer 300, a second gate line layer 500, and a source and drain layer 700 are stacked on the base substrate. These film layers are used to form various signal lines or wires to provide corresponding electrical signals to the sub-pixel driving circuits. Two of the film layers are insulated by an insulating layer. For example, a first gate insulating layer 200 is arranged between the active layer 100 and the first gate layer 300, and a second gate insulating layer 400 is arranged between the first gate line layer 300 and the second gate line layer 500. A dielectric layer 600 is provided between the second gate line layer 500 and the source and drain layer 700. A passivation layer 800 and other film layers are further provided above the source and drain layer 700. Film layers such as an anode layer 900, an organic light-emitting layer, and a cathode layer of each sub-pixel are disposed above the passivation layer 800 to form an OLED light-emitting device. The OLED light-emitting devices of the sub-pixels are separated by a pixel defining layer.

Figure 4:
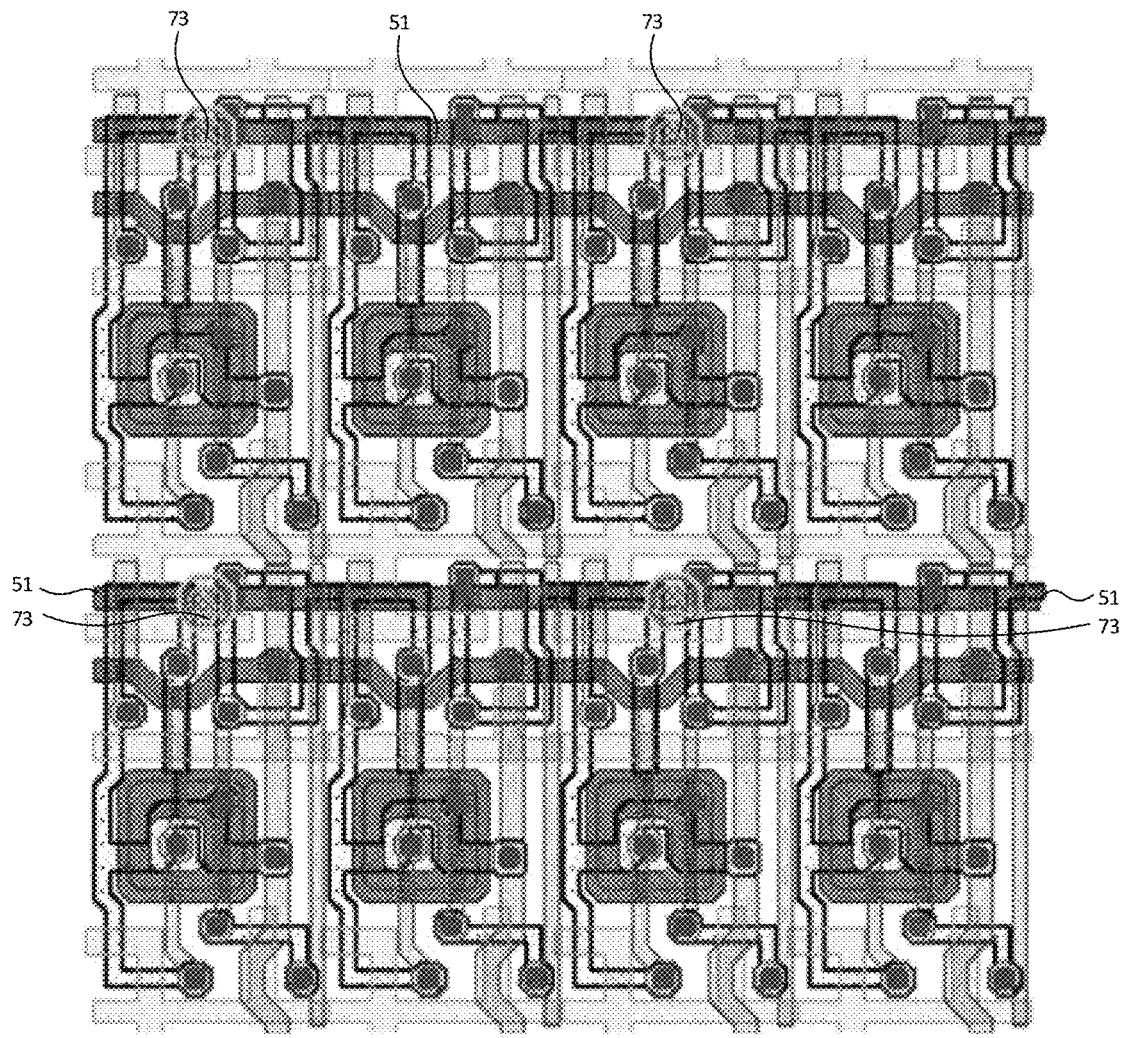
FIG. 4 is a schematic structural diagram of an arrangement of a plurality of sub-pixel arrays in a first implementation.
Figure 5:
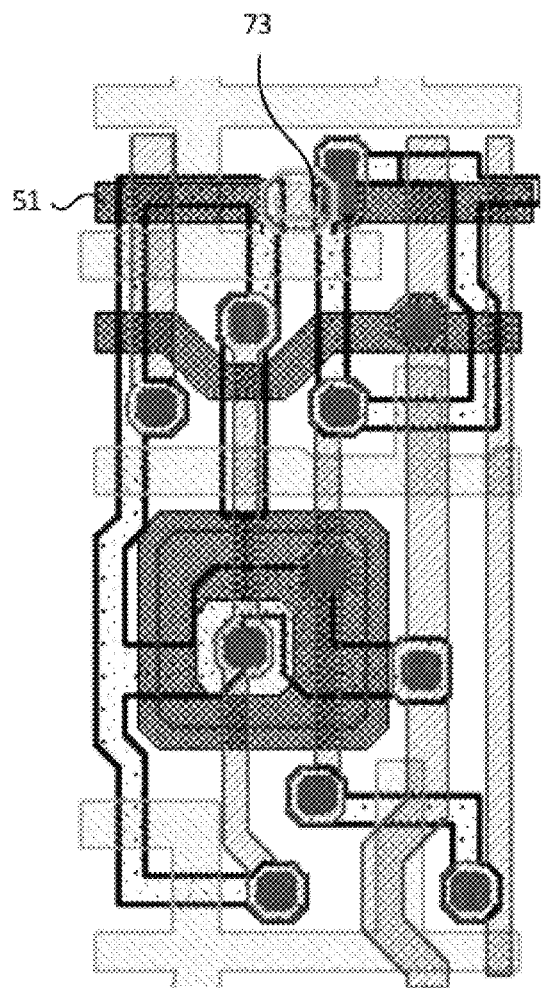
FIG. 5 is a film layer stack structure of a sub-pixel in FIG. 4.
Figure 10:
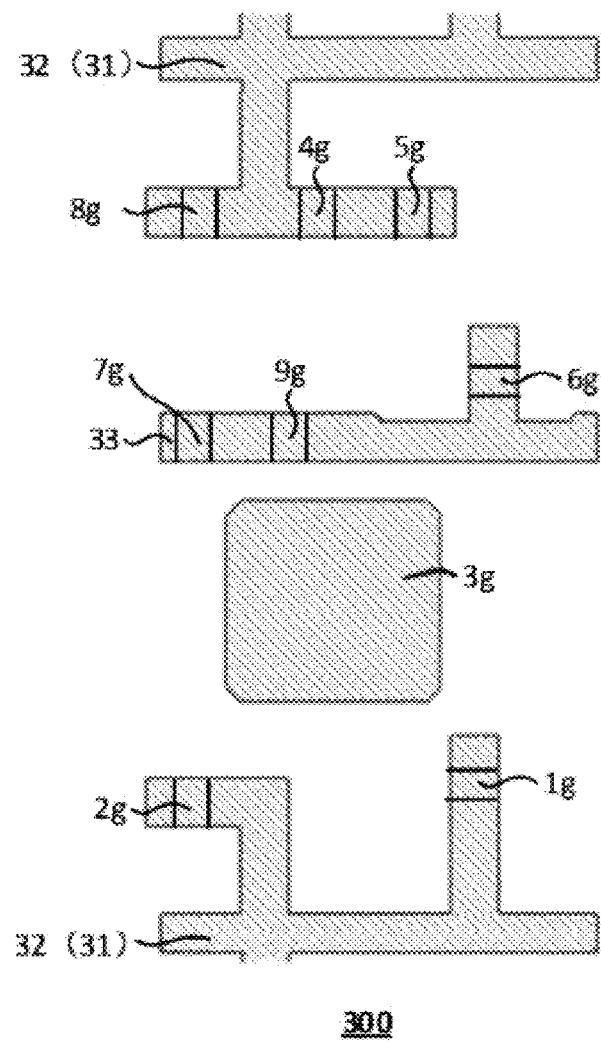
FIG. 10 is a schematic structural diagram of the first gate line layer in FIG. 5.
Figure 11:
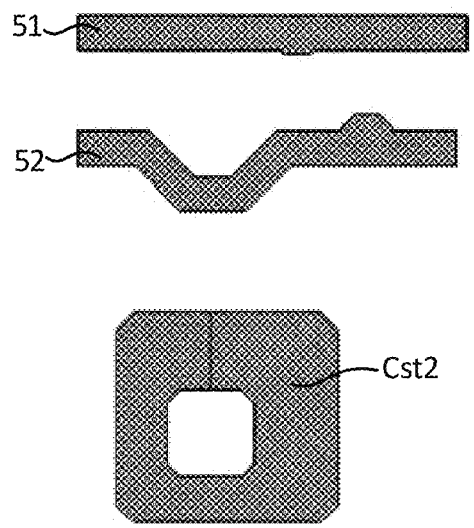
FIG. 11 is a schematic structural diagram of the second gate line layer in FIG. 5.
Figure 12:
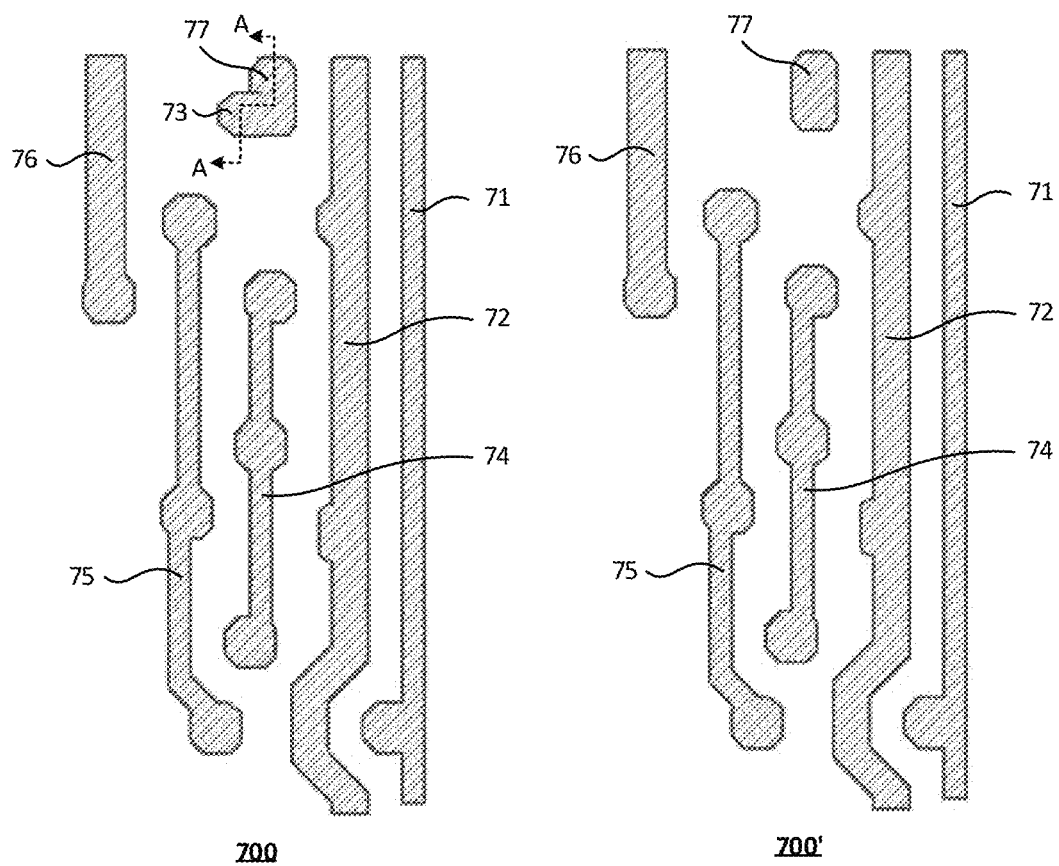
FIG. 12 is a schematic structural diagram of the source and drain layer in FIG. 5.

FIG. 4 shows a schematic structural diagram of an arrangement of a plurality of sub-pixel arrays in an embodiment. FIG. 5 is a stacked structure of a sub-pixel driving circuit of a sub-pixel and various signal lines on an array substrate. FIGS. 6-9 show schematic diagrams of film stacking of the active layer 100, the first gate line layer 300, the second gate line layer 500, and the source and drain layer 700. FIGS. 10-12 are schematic diagrams of the structure of each of the first gate line the layer 300, the second gate line layer 500, and the source and drain layer 700.

Figure 6:
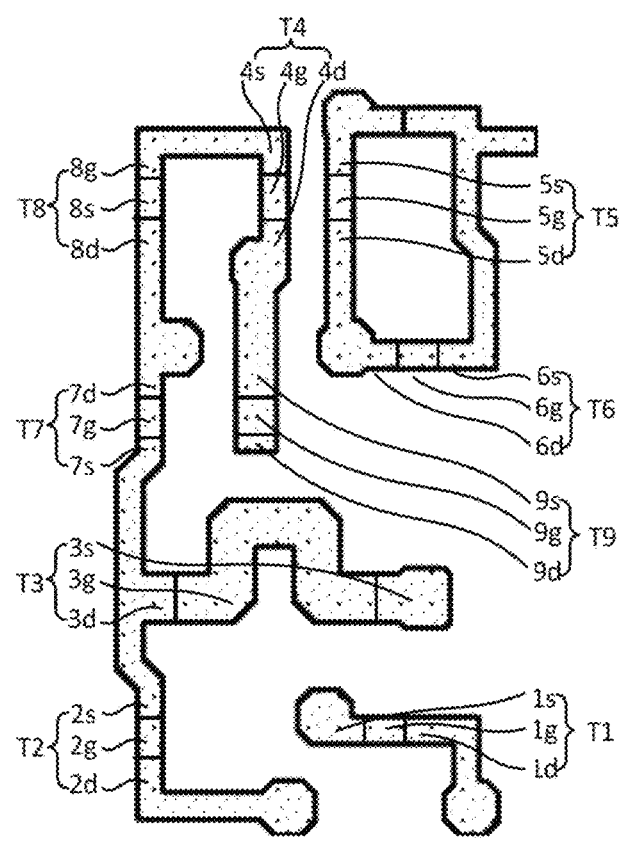
FIG. 6 is a schematic structural diagram of an active layer in FIG. 5.

Referring to FIG. 6, the active layer 100 is used for arranging the channel regions (1g-9g), first electrodes (1s-9s) and second electrodes (1d-9d) of the respective TFT transistors.

Figure 7:
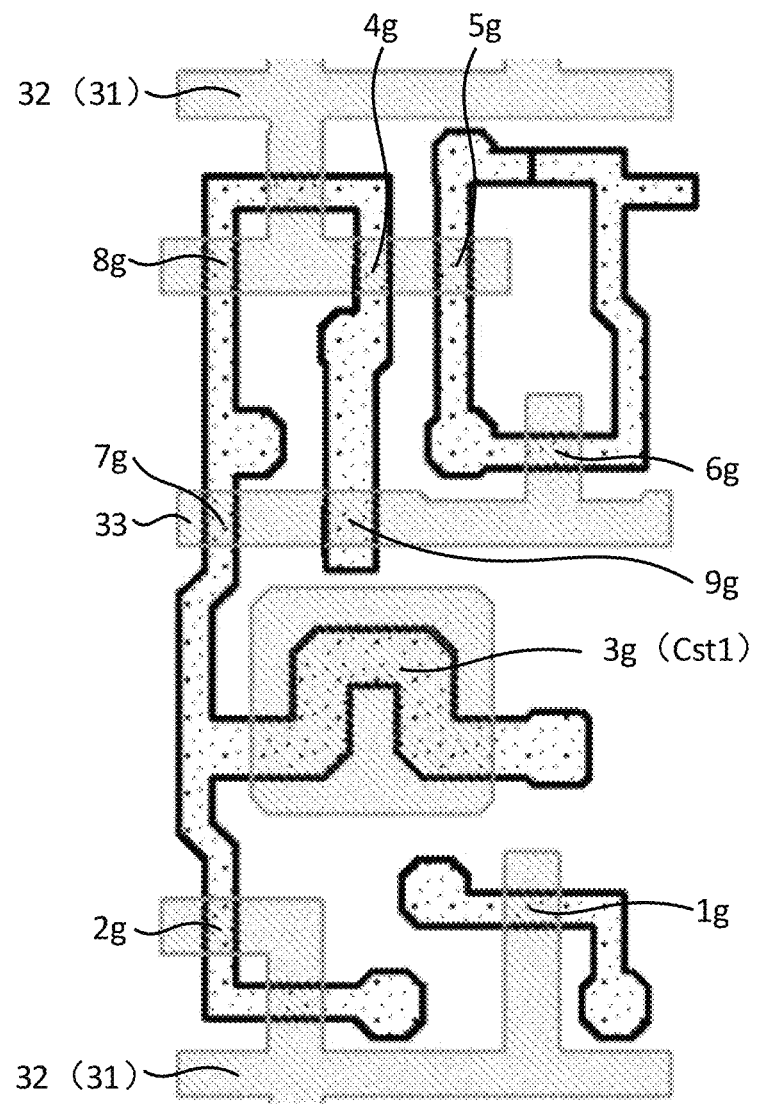
FIG. 7 is a schematic diagram showing stacking of the active layer and a first gate line layer in FIG. 5.

Referring to FIGS. 7 and 10, the first gate line layer 300 is used to arrange the gates (e.g., 1g to 9g) of the transistors in the sub-pixel driving circuit, the first electrode plate Cst1 of the capacitor, a plurality of scan lines 31, a plurality of reset signal lines 32, a plurality of light-emitting control signal lines 33 and other structures. The plurality of scan lines 31 are arranged at intervals in the column direction and extend in the row direction, and each scan line is used for providing the scan signal to sub-pixels located in a corresponding same row in the row direction. A plurality of reset signal lines 32 are arranged at intervals in the column direction and extend in the row direction, and each reset signal line is used for providing reset signal to sub-pixels located in a corresponding same row in the row direction. The plurality of light-emitting control signal lines 33 extend in the row direction and are arranged at intervals in the column direction, and each light-emitting control signal line is used for providing the light-emitting control signal to sub-pixels located in a corresponding same row in the row direction. In each sub-pixel area, the reset signal line 32 is located at the top, the scan line 31 is located at the bottom, the light-emitting control signal line 33 is located between the reset signal line 32 and the scan line 31, and the first electrode plate Cst1 of the capacitor is located between the light-emitting control signal line 33 and the scan line 31. In the column direction, a scan line 31 of a sub-pixel of a stage may be connected to a reset signal line 32 of a next-stage sub-pixel, so that the scan signal of the sub-pixel of the stage can be used as the reset signal of the next-stage sub-pixel, thereby avoiding introducing a separate dedicated signal line for the reset signal, and effectively reducing the wiring space.

Figure 8:
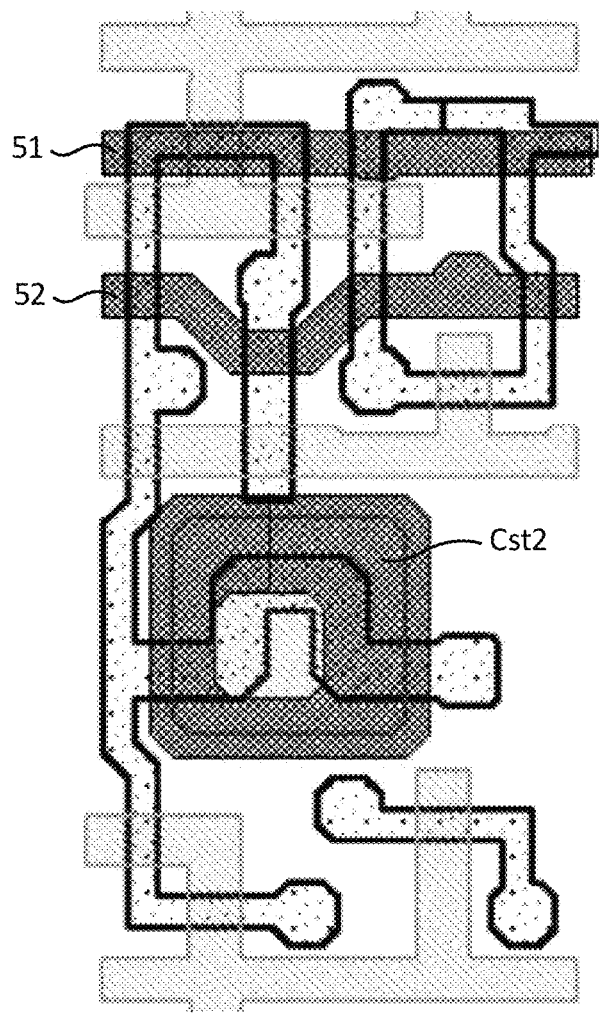
FIG. 8 is a schematic diagram showing stacking of the active layer, the first gate line layer and a second gate line layer in FIG. 5.

Referring to FIG. 8 and FIG. 11, the second gate line layer 500 is used to arrange structures such as the second electrode plate Cst2 for forming the capacitor, and the initialization signal lines 51 in embodiments of the present disclosure are also arranged in the second gate line layer 500. The second electrode plate Cst2 of the capacitor corresponds to the first electrode plate Cst1 in the thickness direction of the array substrate. The projection of a corresponding initialization signal line 51 on the array substrate is located on a side of the second electrode plate Cst2 close to the projection of the reset signal line 32. In an embodiment, the projections of the initialization signal line 51 and the reset signal line 32 on the base substrate overlap, which greatly saves wiring space.

Figure 9:
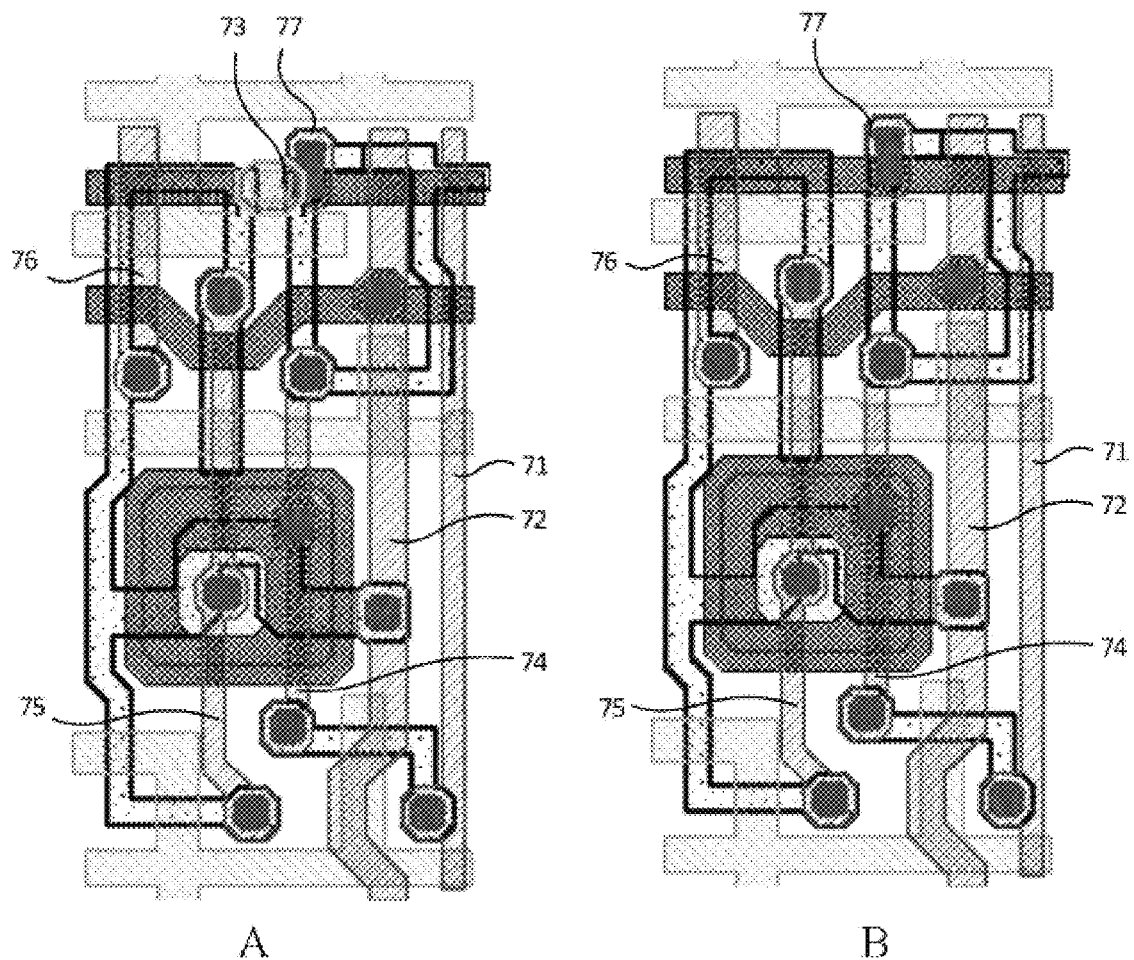
FIG. 9 is a schematic diagram showing stacking of the active layer, the first gate line layer, the second gate line layer, and a source and drain layer in FIG. 5.

Referring to FIG. 9 and FIG. 12, the source and drain layer 700 are used to arrange power lines 72, data lines 71 and other structures which are disposed vertically. The power lines 72 extend along the column direction and are arranged at intervals along the row direction, and each power line is used to provide the power signal to sub-pixels located in a corresponding same column. The data lines 71 extend along the column direction and are arranged at intervals along the row direction, and each data line is used for providing the signal of the data line to sub-pixels located in a corresponding same column. The projections of the power lines 72 and the data lines 71 on the array substrate do not overlap with the first electrode plate Cst1 and the second electrode plate Cst2 of the capacitor.

Referring to FIGS. 8 and 11, in one implementation, the second gate line layer 500 further includes a plurality of power leads 52. The plurality of power leads 52 extend along the row direction and are arranged at intervals along the column direction. Power lines 72 in a same row are connected to one of the power leads 52 through via holes in the dielectric layer 600, so that the power leads 52 and the power lines 72 also form a grid-like structure, which can reduce the voltage drop of the power supply voltage.

Referring to FIGS. 9 and 12, in one implementation, the source and drain layer 700 further includes a plurality of second conductive connection portions 74. The second conductive connection portions 74 are arranged in the source and drain layer 700 and distributed in sub-pixel areas. In each sub-pixel area, the projection of a corresponding second conductive connection portion 74 on the base substrate overlaps with the projections of the drain 1d of the first transistor T1, the drain 5d of the fifth transistor T5, and the drain 6d of the sixth transistor T6, the corresponding second conductive connection portion 74 is connected to the drain 1d of the first transistor T1, the drain 5d of the fifth transistor T5, and the drain 6d of the sixth transistor T6 through via holes which pass through the first gate insulating layer 200, the second gate insulating layer 400, and the dielectric layer 600. The projection of the second conductive connection portion 74 on the base substrate also overlaps with the projection of the second electrode plate Cst2 of the capacitor, and the second conductive connection portion 74 is electrically connected with the second electrode plate Cst2 of the capacitor through a via hole penetrating through the dielectric layer 600. That is to say, 1d, 5d, and 6d are all electrically connected to the second electrode plate Cst2 of the capacitor through the second conductive connection portion 74.

Referring to FIG. 9 and FIG. 12, in one implementation, the source and drain layer 700 further includes a plurality of third conductive connection portions 75. The third conductive connection portions 75 are arranged in the source and drain layer 700 and distributed in the sub-pixel areas. In each sub-pixel area, the projection of a corresponding third conductive connection portion 75 on the base substrate overlaps with the projections of 2d of the second transistor T2 and first electrode 9s of the ninth transistor T9, and the corresponding third conductive connection portion 75 is connected with 2d of the second transistor T2 and first electrode 9s of the ninth transistor T9 through via holes which pass through the first gate insulating layer 200, the second gate insulating layer 400 and the dielectric layer 600. The projection of the third conductive connection portion 75 on the base substrate also overlaps with the projection of the first electrode plate Cst1 of the capacitor, and the third conductive connection portion 7 is electrically connected with the first electrode plate Cst1 of the capacitor through a via hole which passes through the second gate insulating layer 400 and the dielectric layer 600. That is to say, both 2d and 9s are electrically connected to the first electrode plate Cst1 of the capacitor through the third conductive connection portion 75.

Referring to FIG. 9 and FIG. 12, in one implementation, the source and drain layer 700 further includes a plurality of fourth conductive connection portions 76. The fourth conductive connection portions 76 are arranged in the source and drain layer 700 and distributed in sub-pixel areas. In each sub-pixel area, the projection of a corresponding fourth conductive connection portion 76 on the base substrate overlaps with 8d of the eighth transistor T8, and the fourth conductive connection portion 76 is electrically connected with 8d of the eighth transistor T8 through a via hole which passes through the first gate insulating layer 200, the second gate insulating layer 400, and the dielectric layer 600. That is, 8d is electrically connected to the anode 91 through the fourth conductive connection 76.

Referring to FIG. 9 and FIG. 12, in one implementation, the source and drain layer 700 further includes a plurality of fifth conductive connection portions 77. The fifth conductive connection portions 77 are arranged in the source and drain layer 700 and distributed in sub-pixel areas. Each fifth conductive connection portion 77 is used for connecting the sources of T4, T5, T6, and T8 with the initialization signal line 51. Specifically, the fifth conductive connection portion 77 is connected to the source 5s of the fifth transistor T5 in the active layer 100 through a via hole which penetrates the first gate insulating layer 200, the second gate insulating layer 400 and the dielectric layer 600. The conductive connection portion 77 is further connected to the initialization signal line 51 in the second gate layer through another via hole which penetrates the dielectric layer 600. In this way, the source electrode 5s of the fifth transistor T5 is electrically connected to the initialization signal line 51. Further, referring to FIG. 4, since the source 5s of the fifth transistor T5 and the source 6s of the sixth transistor T6 are commonly connected to the source electrode 8s of the eighth transistor T8 and the source electrode 8s of the fourth transistor T4 in the right sub-pixel in the row direction, and thus the sources of T4, T5, T6, and T8 are all connected to the initialization signal line 51, thereby reducing the number of via holes.

Figure 13:
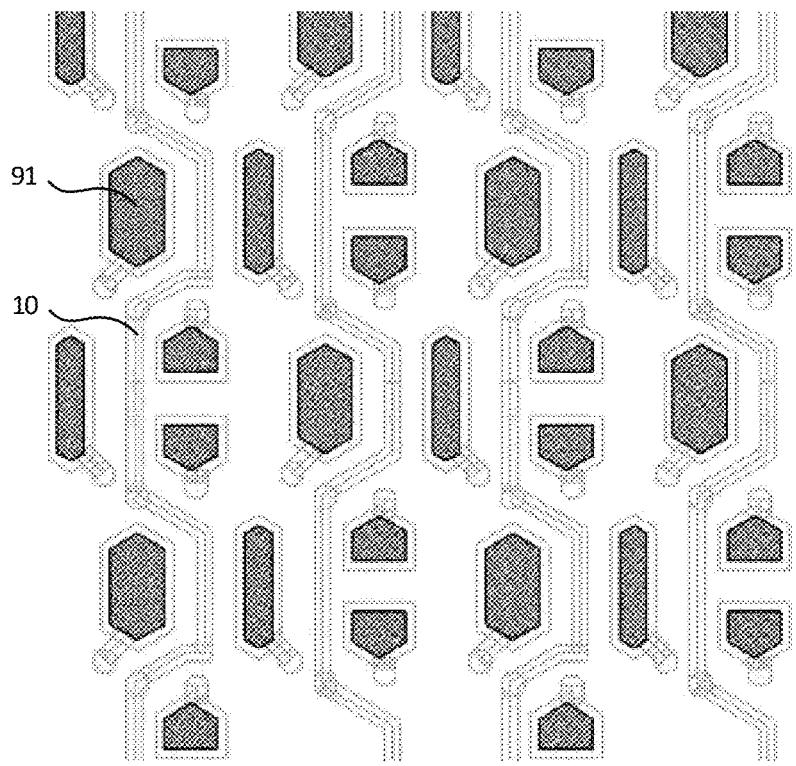
FIG. 13 is a schematic structural diagram of an anode layer.

An OLED light-emitting device is also disposed on the array substrate. A pixel defining layer is disposed above the source and drain layer 700. The pixel defining layer has a plurality of openings for defining sub-pixels. The anode layer 900 is used for arranging the anode 91 of the OLED light emitting device and is located in an opening of the pixel defining layer. Further, an organic light-emitting layer and a cathode layer are also arranged in the opening. The film layer structure of the OLED light-emitting device may adopt a conventional structure, which will not be repeated here. FIG. 13 is a schematic structural diagram of an anode layer 900 of an RGBG pixel structure.

In an embodiment, referring to FIG. 13, the connecting wire 10 is arranged in the anode layer 900, passes through the gap between two anodes 91 in the vertical direction, and is insulated from any anode 91. The connection lines 10 are covered by the pixel definition layer to avoid contact with other film layers above.

It should be noted that, the connection line 10 is formed in the anode layer 900 by etching the anode 91 material (for example, ITO/Ag/ITO), and the anode 91 material is usually etched by a wet etching method, and for a panel with high PPI, the etching is relatively difficult. Thus, too many connection lines 10 in the horizontal direction should be avoided as much as possible, so as to ensure that the entirety is vertically routed. If a grid-like closed pattern is formed in the anode layer 900, it is easy to cause poor etching.

In an embodiment, the number of connection lines 10 is smaller than the number of sub-pixels in the row direction. That is, in the row direction, the initialization signal lines 51 and the connection lines 10 are electrically connected through via holes in a part of sub-pixel areas. Referring to FIGS. 1 and 4, the number of connection lines 10 is half of the number of sub-pixels in the row direction, and one connection line is set every other sub-pixel, and an initialization signal line 51 is connected with one connection line 10 through a via hole every other sub-pixel. Therefore, one of every two adjacent sub-pixels in the row direction is provided with a connection line 10 and a via hole, and the other is not provided with a connection 10 and a via hole. In some other embodiments, when the number of connection lines 10 is smaller than the number of sub-pixels in the row direction, there may be different numbers of sub-pixels between two adjacent connection lines 10.

Figure 27:
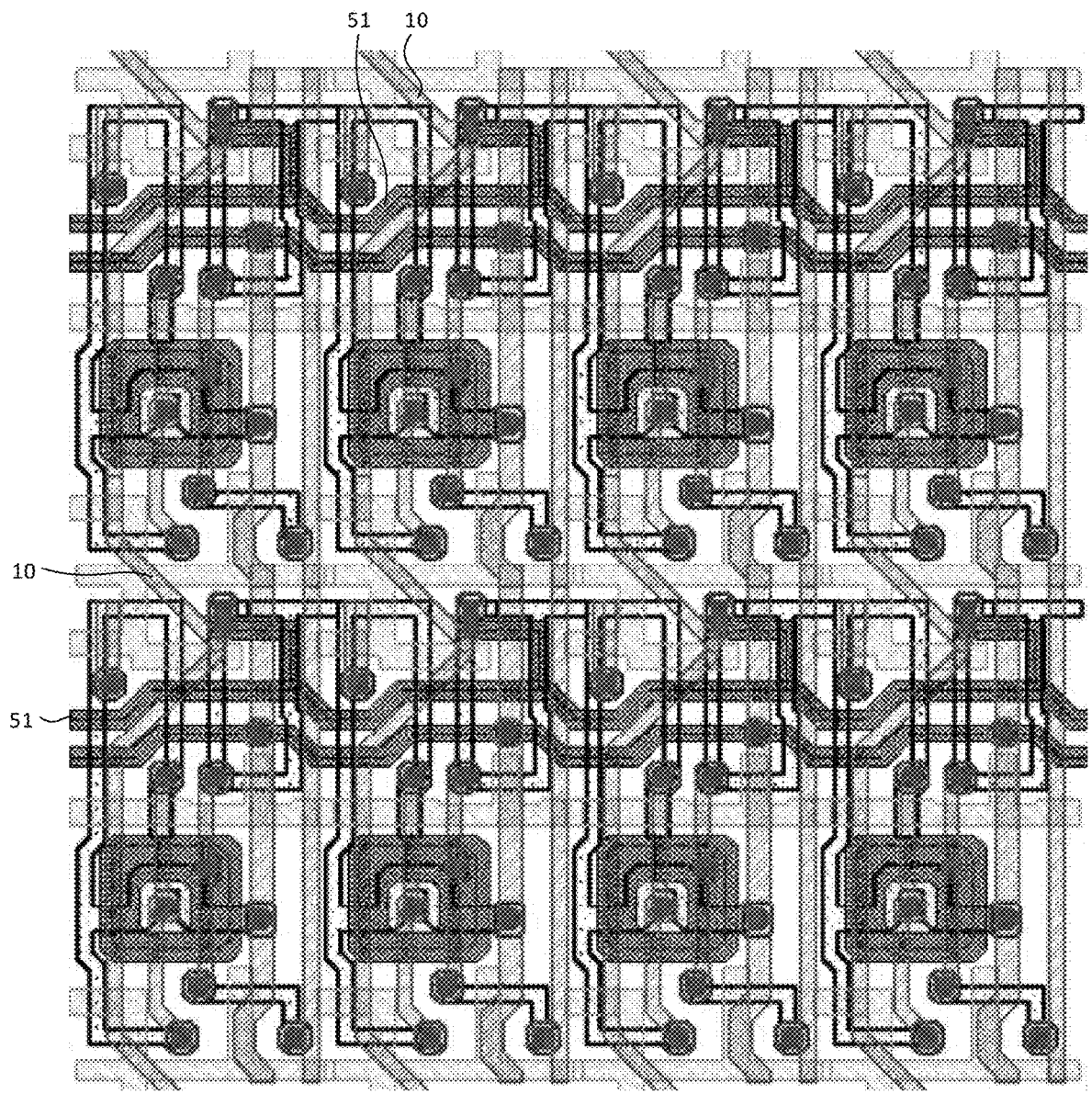
FIG. 27 is a schematic structural diagram of an arrangement of a plurality of sub-pixel arrays in a fourth embodiment.

In some other embodiments, referring to FIG. 27, the number of connection lines 10 may be equal to the number of sub-pixels in the row direction. That is to say, in the row direction, an initialization signal line 51 and a connection lines 10 are electrically connected through a via hole in each sub-pixel area. Therefore, each sub-pixel in the row direction is provided with a connection line 10 and a via hole, as long as the projections of the plurality of connection lines 10 and the plurality of initialization signal lines 51 on the base substrate can form a grid-like structure. It can be understood that the more the number of connection lines 10, the denser the grid, and the more transmission paths for the initialization signal, and the more the IR drop can be reduced. But, the pressure on the wiring space will be greater, and the manufacturing process will be more difficult. Therefore, the specific number of the connection lines can be set according to actual situations.

In order to realize the connection between the initialization signal lines 51 and the connection lines 10, referring to FIG. 9 and FIG. 12, the array substrate further includes a plurality of first conductive connection portions 73 arranged in the source and drain layer 700. The plurality of first conductive connection portions 73 are distributed sub-pixel areas where the projections of the initialization signal lines 51 and the connection lines 10 intersect. FIG. 9A shows a stacked structure where the projections of the initialization signal lines 51 and the connection lines 10 intersect, and FIG. 9B shows stacked structure where the projections of the initialization signal lines 51 and the connection lines 10 do not intersect. In other words, not all the source and drain layer 700 of the sub-pixels are provided with a first conductive connection portion 73, but the first conductive connection portion 73 is provided in a sub-pixel where the initialization signal line 51 and the connection line 10 are connected. In FIG. 12, 700 represents the structure of the source and drain layer provided with the first conductive connection portion 73, and 700' represents the structure of the source and drain layer provided without the first conductive connection portion 73. In a sub-pixel area where the first conductive connection portion 73 is provided, the projection of the first conductive connection portion 73 on the base substrate has an overlapping area with the initialization signal line 51 and the connection line 10, respectively, and the first conductive connection portion 73 is connected with the initialization signal line 51 through a via hole which passes through the dielectric layer 600, and the first conductive connection portion 73 is connected with the connection line 10 through a via hole which passes through the passivation layer 800, so that the initialization signal line 51 is electrically connected with the connection line 10 through the first conductive connection portion 73.

Figure 14:
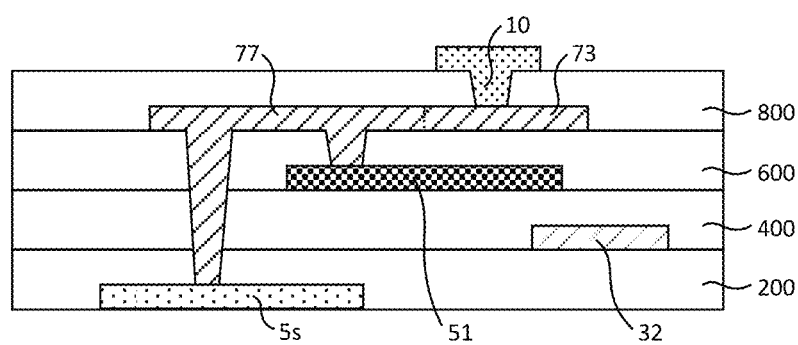
FIG. 14 is a cross-sectional view taken along a A-A direction in FIG. 12.

In an embodiment, as shown in FIG. 12, the first conductive connection portion 73 and the fifth conductive connection portion 77 are connected integrally, which can simplify the preparation of the conductive connection portions in the source and drain layer 700. Since the first conductive connection portion 73 and the fifth conductive connection portion 77 are integrally connected, the projection of the first conductive connection portion 73 on the base substrate and the initialization signal line 51 have an overlapping area, which can also be understood as the projection of the fifth conductive connection portion 77 on the base substrate has an overlapping area with the initialization signal line 51, and the connection between the fifth conductive connection portion 77 and the initialization signal line 51 can be realized. Correspondingly, the first conductive connection portion 73 is connected to the connection wire 10 through a via hole, and this can also be understood that the fifth conductive connection portion 77 is connected to the connection wire 10 through a via hole. The shape in which the first conductive connection portion 73 and the fifth conductive connection portion 77 are integrally connected includes but is not limited to the L-shape shown in FIG. 12. FIG. 14 shows a cross-sectional view of the first conductive connection portion 73 and the fifth conductive connection portion 77, which is a cross-sectional view taken along the A-A direction in FIG. 12. When via holes are provided, the plurality of via holes are staggered from each other in the thickness direction.

In the embodiment shown in FIG. 4, the reset signal line 32 is connected to a previous-stage scan line 31, the initialization signal line 51 and the reset signal line 32 overlap, and the connection line 10 is arranged in the anode layer 900, which greatly saves wiring space and can be suitable for panels with higher PPI, such as panels with PPI greater than 410.

Figure 15:
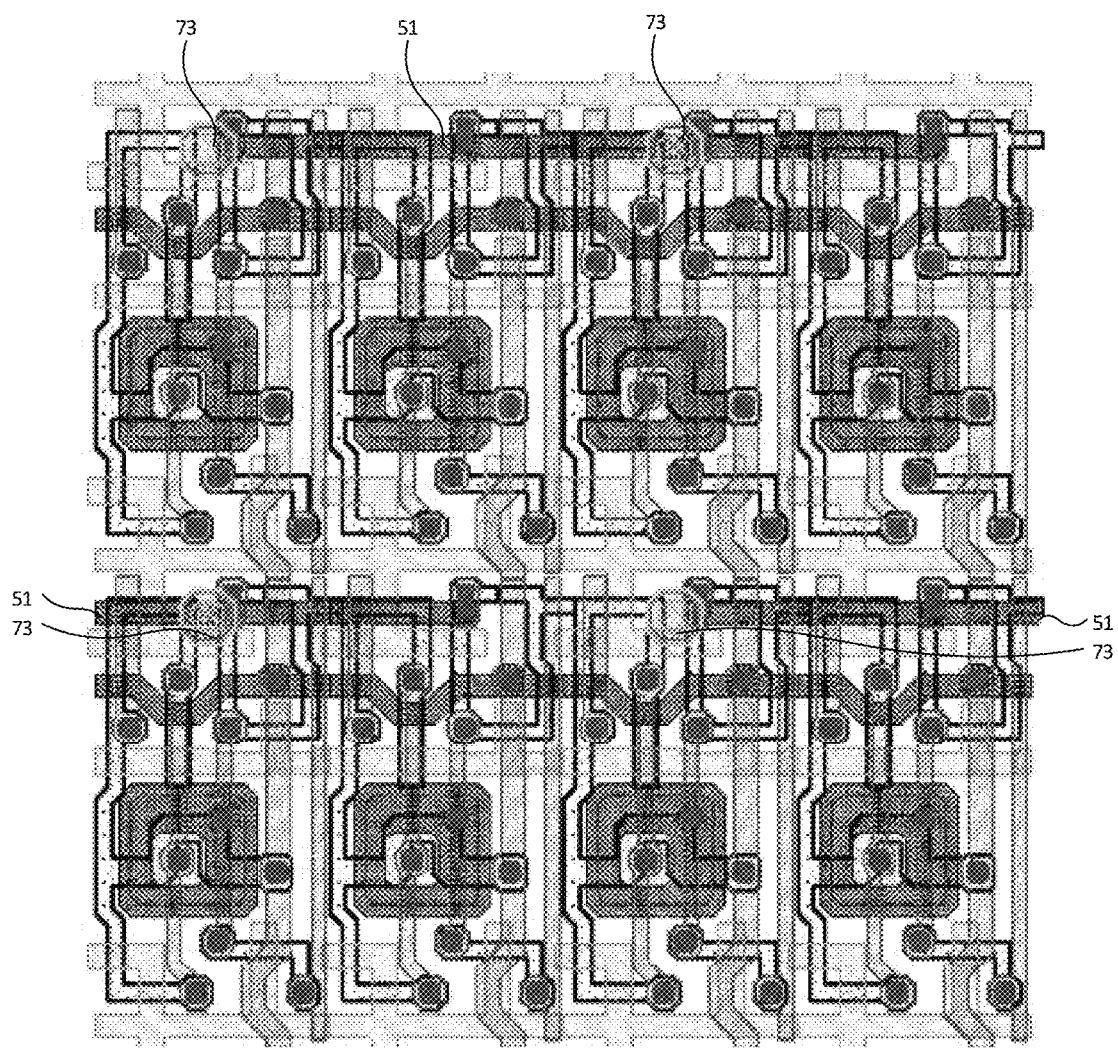
FIG. 15 is a schematic structural diagram of an arrangement of a plurality of sub-pixel arrays in a second implementation.
Figure 16:
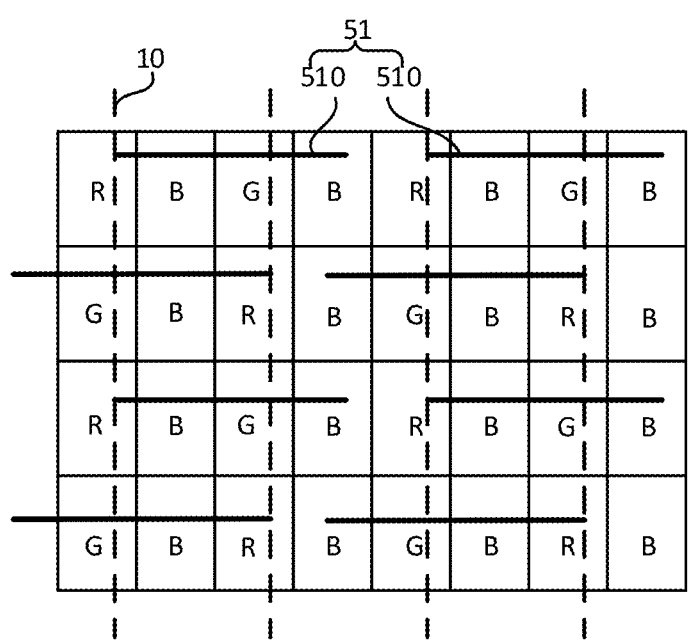
FIG. 16 is a schematic diagram of a positional relationship between initialization signal lines and connection lines in the second implementation.

In another exemplary implementation, in order to minimize the influence of the cross static electricity generated by the overlapping of the initialization signal line 51 and the reset signal line 32 on the panel, the structures in FIG. 1 and FIG. 5 may be modified. Referring to FIGS. 15 and 16, the initialization signal line 51 is no longer a whole continuous signal line, but includes multiple signal segments 510 separated from each other. That is, each initialization signal line 51 is divided into a plurality of small horizontal segments, and each signal segment 510 corresponds to a corresponding pixel unit one by one. The projection of each signal segment 510 has no overlap with the projection of a corresponding reset signal line 32 in at least one of sub-pixel areas in a corresponding pixel unit, and the projection of each signal segments 510 intersects with the projection of the reset signal line 32 in remaining sub-pixel areas in the corresponding pixel unit.

For example, as shown in FIG. 15, each signal segment 510 spans one pixel unit. In one pixel unit, the projection of the signal segment 510 overlaps with the projection of the reset signal line 32 in three sub-pixel areas, and the projection of the signal segment 510 does not overlap with reset signal line 32 in a sub-pixel area at an end, and the signal segment 510 is ended at a side of the reset signal line 32. In this way, the probability of cross static electricity being generated in the pixel unit can be reduced, and the cross static electricity in one pixel unit will not affect other pixel units.

Figure 17:
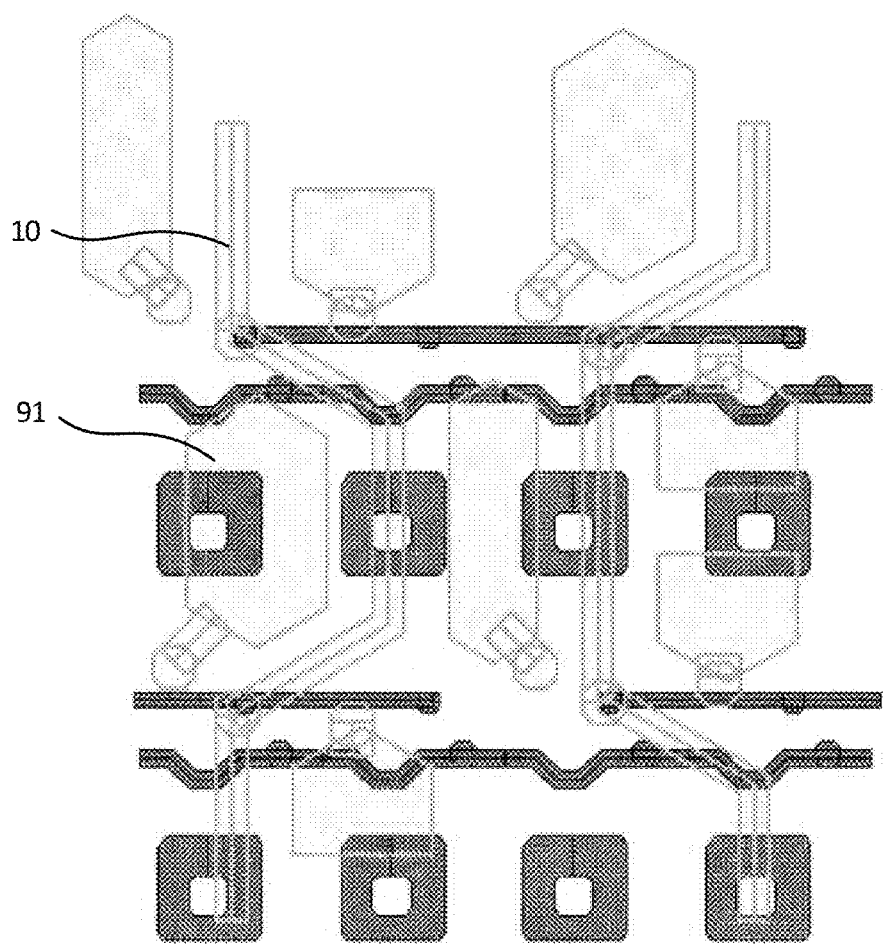
FIG. 17 is a perspective view showing stacking of the anode layer and the second scan line layer in the second implementation.

It should be noted that, even if the initialization signal line 51 is divided into a plurality of signal segments 510, each vertical connection line 10 is connected to a signal segment 510. Therefore, it can be considered that each initialization signal line 51 is connected with each connection line 10. In addition, although the initialization signal line 51 in the horizontal direction is disconnected in this embodiment, since the initialization signal line still intersects with the connection line in the vertical direction, and this is also regarded as a grid-like structure. That is to say, the grid-like structure in embodiments of the present disclosure includes the complete grid structure shown in FIG. 1, and also includes the grid structure that is broken in the middle shown in FIG. 16. FIG. 17 is a perspective view of the connection line 10 provided in the anode layer 900 and the initialization signal line 51 provided in the second gate layer.

Figure 18:
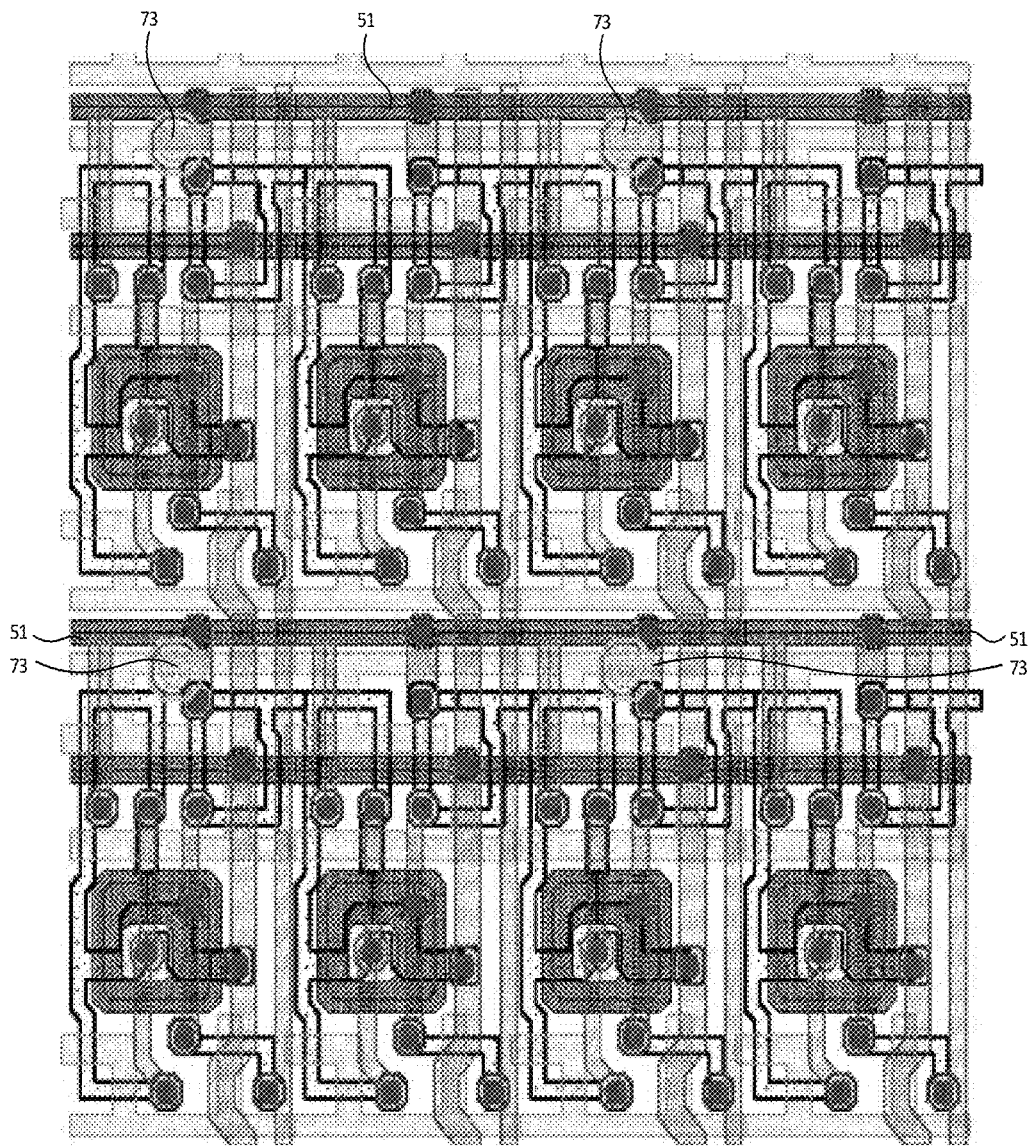
FIG. 18 is a schematic structural diagram of an arrangement of a plurality of sub-pixel arrays in a third implementation.
Figure 19:
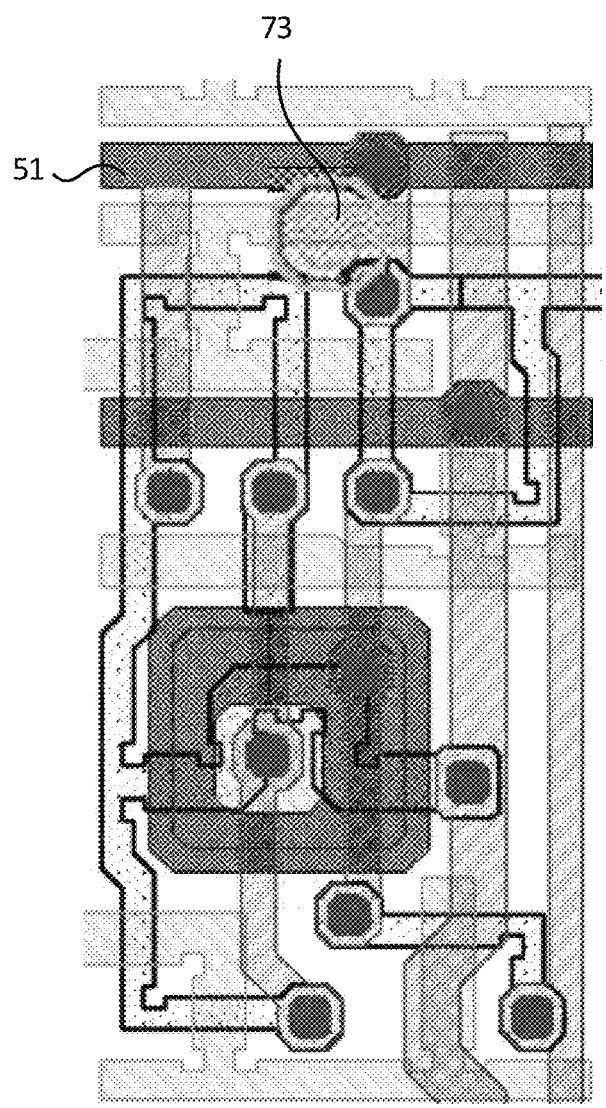
FIG. 19 is a film layer stack structure of a sub-pixel in FIG. 18.
Figure 20:
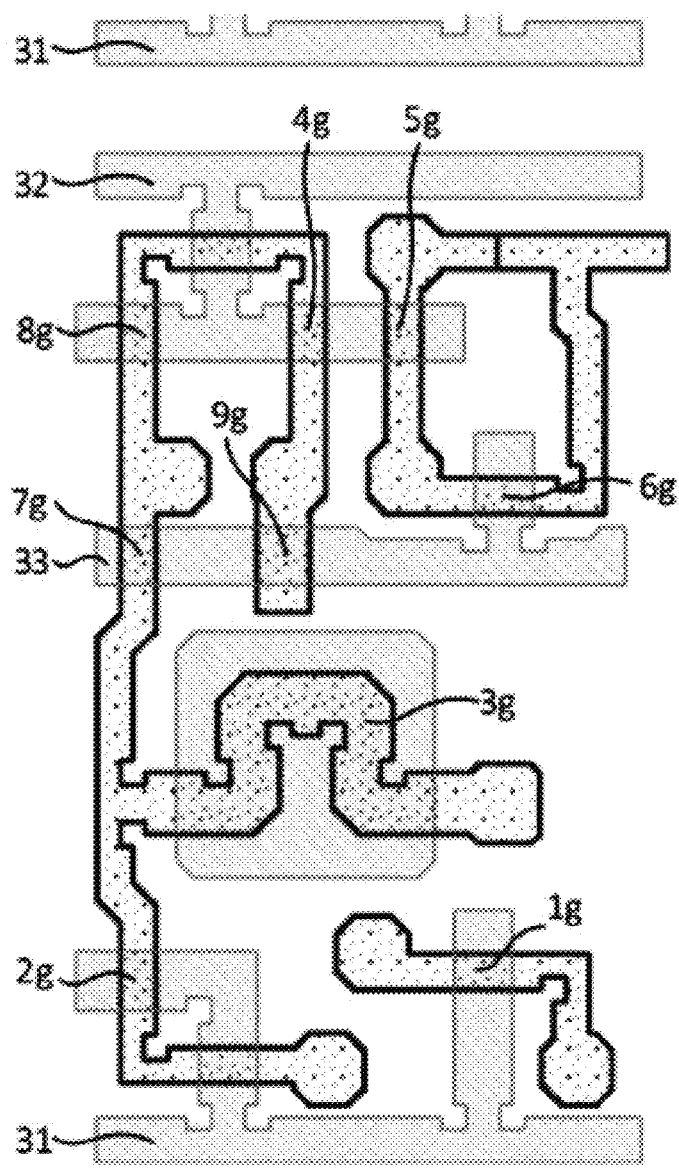
FIG. 20 is a schematic structural diagram of the first gate line layer in FIG. 19.
Figure 21:
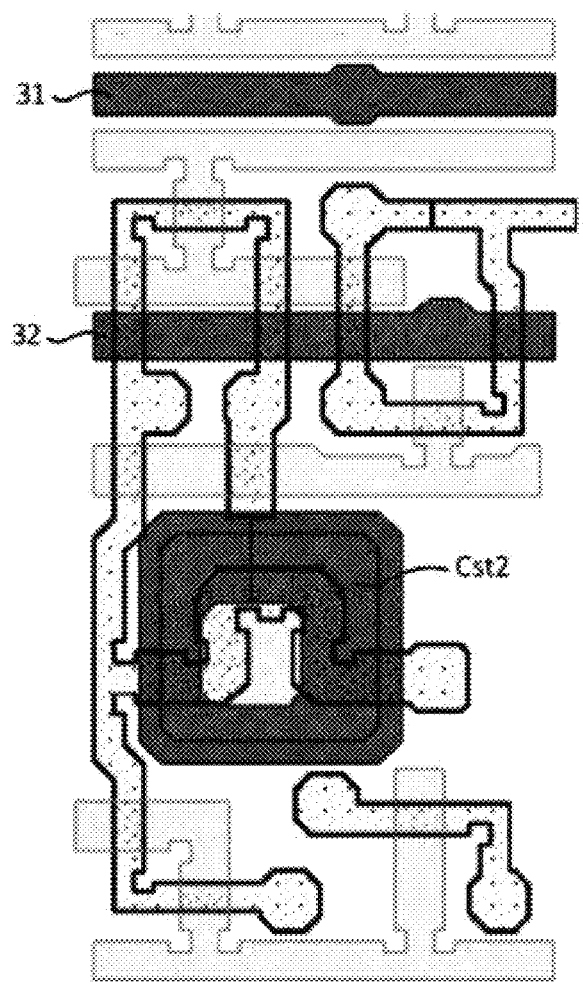
FIG. 21 is a schematic diagram showing stacking of the active layer, the first gate line layer and the second gate line layer in FIG. 19.
Figure 22:
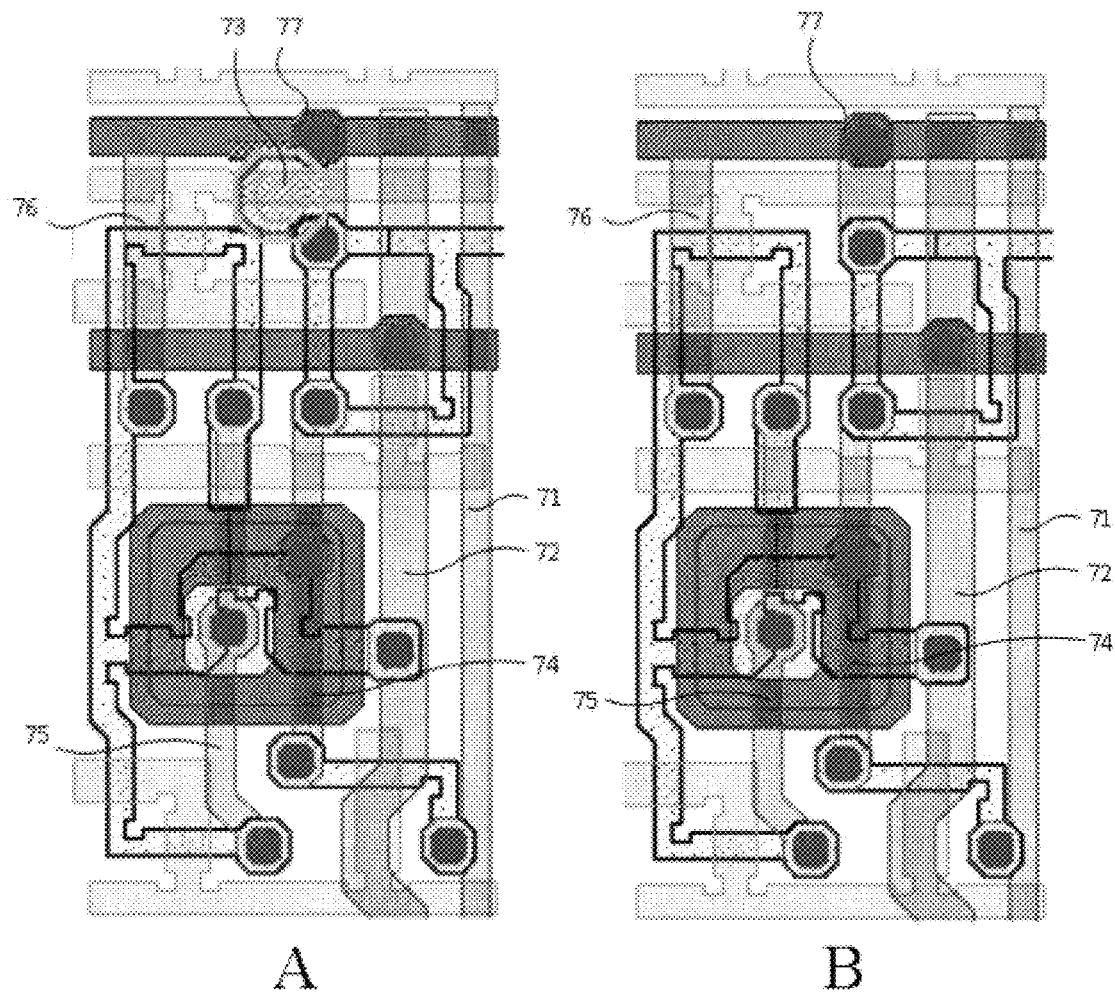
FIG. 22 is a schematic diagram showing stacking of the active layer, the first gate line layer, the second gate line layer, and the source and drain layer in FIG. 19.
Figure 23:
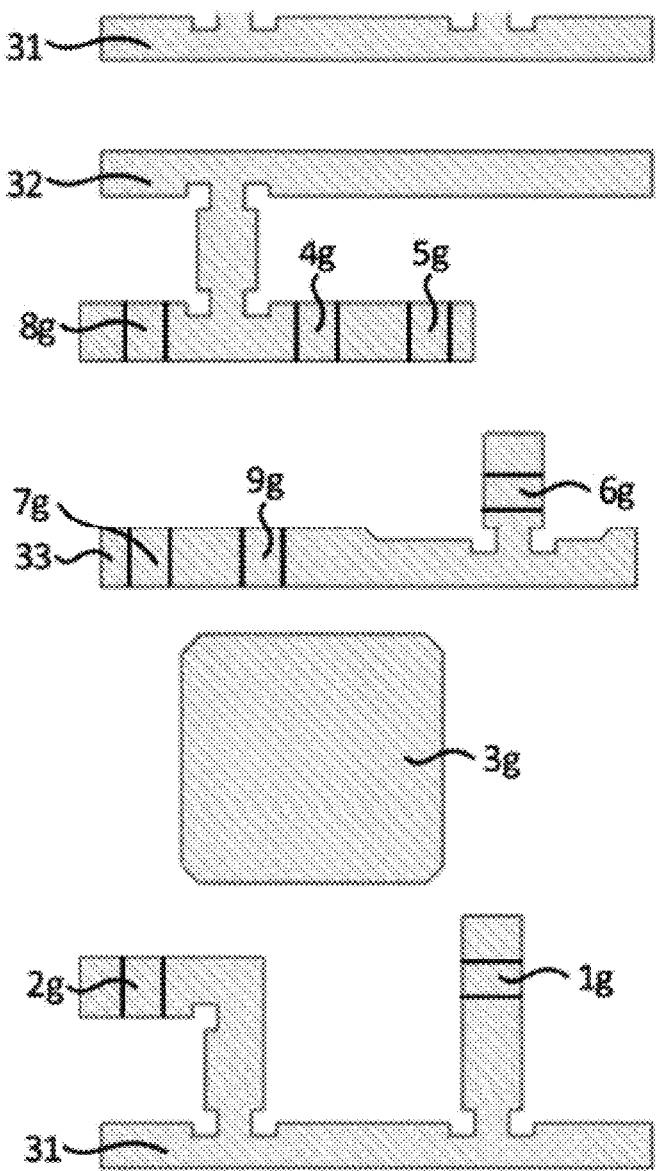
FIG. 23 is a schematic structural diagram of the first gate line layer in FIG. 19.
Figure 24:
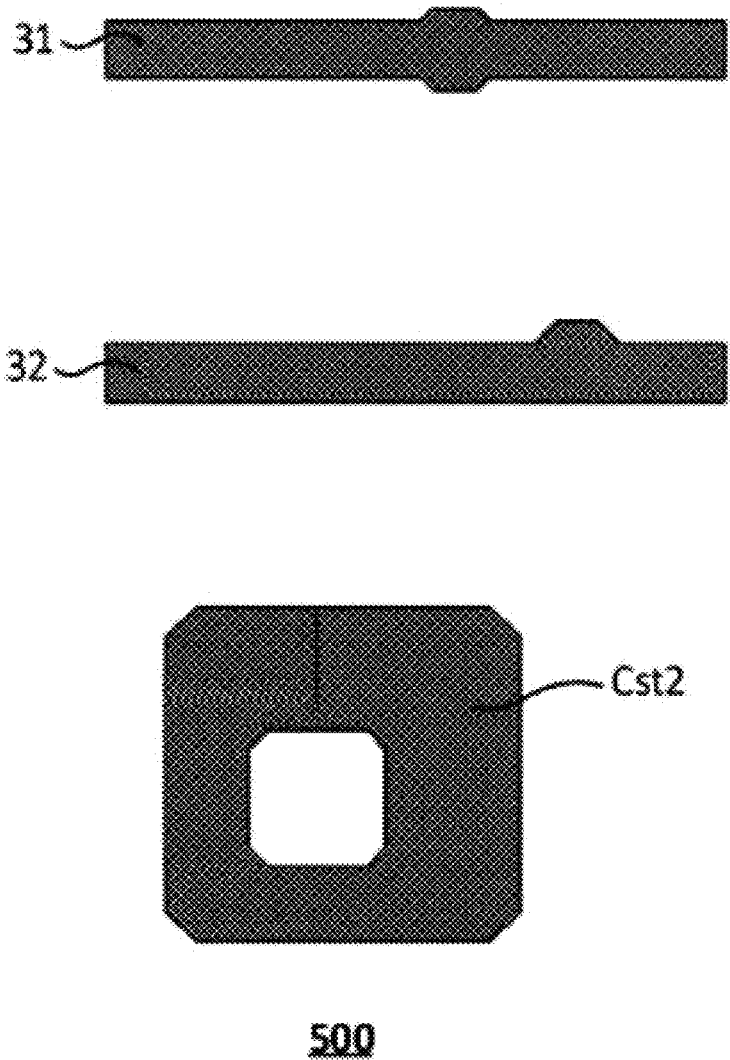
FIG. 24 is a schematic structural diagram of the second gate line layer in FIG. 19.
Figure 25:
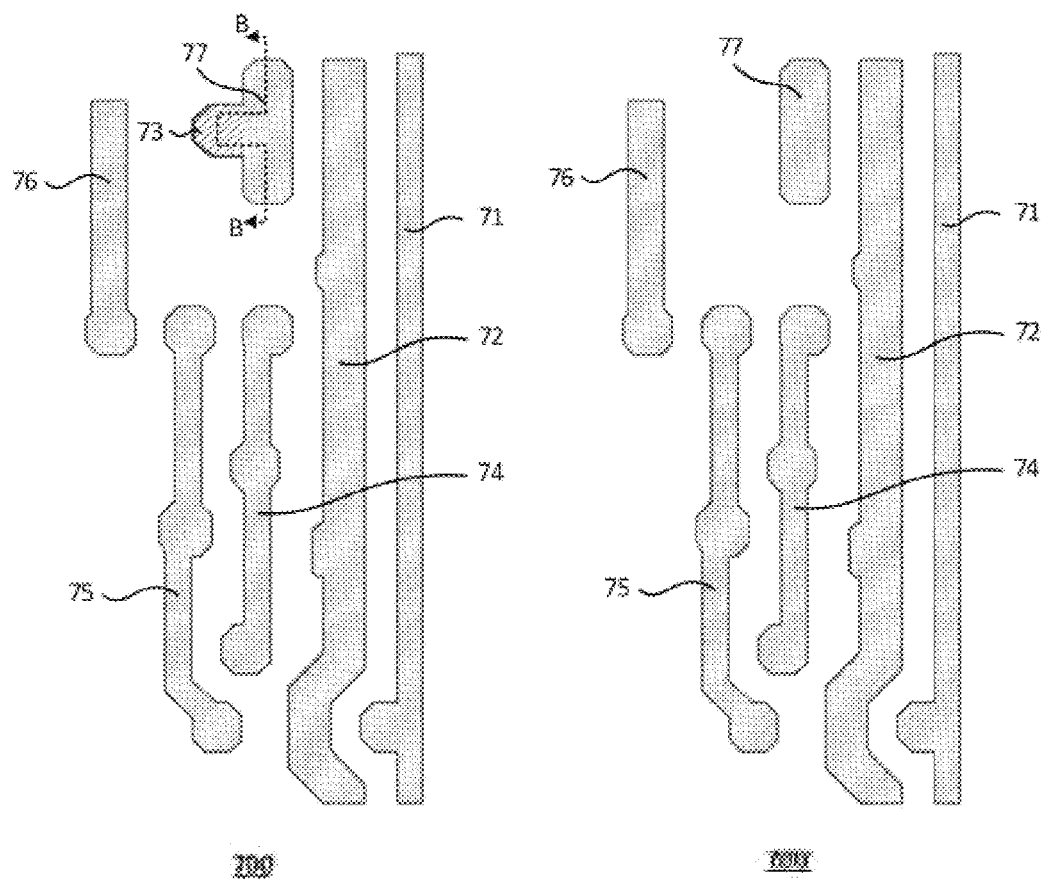
FIG. 25 is a schematic structural diagram of the source and drain layer in FIG. 19.

FIG. 18 shows a schematic structural diagram of an arrangement of a plurality of sub-pixel arrays in another embodiment. FIG. 19 is a stacked structure of a sub-pixel driving circuit of one sub-pixel on the array substrate and various signal lines. FIGS. 20-22 are schematic diagrams showing film stacking of the first gate line layer 300, the second gate line layer 500, and the source and drain layer 700. FIGS. 23-25 are schematic diagrams showing the structures of the first gate line layer 300, the second gate line layer 500 and the source and drain layer 700. The structure of the active layer 100 is the same as that of FIG. 6 in the previous embodiment, and thus related drawings are omitted here. In this embodiment, the connection line 10 is also provided in the anode layer 900. FIG. 22A shows a stacked structure in which the projections of the initialization signal lines 51 and the connection lines 10 intersect, and FIG. 22B shows a stacked structure in which the initialization signal lines 51 do not intersect the projections of the connection lines 10. In FIG. 25, 700 represents the structure of the source and drain layer provided with the first conductive connection portion 73, and 700' represents the structure of the source and drain layer without the first conductive connection portion 73.

Referring to FIG. 20 and FIG. 21, in a sub-pixel area, the projection of the initialization signal line 51 on the base substrate is located between the projection of the reset signal line 32 of the current-stage sub-pixel and the projection of the scan line 31 of the previous-stage sub-pixel. In addition, the projections of the initialization signal line 51, the reset signal line 32 of the current-stage sub-pixel, and the scan line 31 of the previous-stage sub-pixel do not overlap. That is to say, the projections of the initialization signal line 51, the reset signal line 32 of current-stage sub-pixel, and the scan line 31 of previous-stage sub-pixel are all spaced apart from each other. The scan line 31 of a sub-pixel of a stage may be connected with the reset signal line 32 of the sub-pixel of a next stage in a peripheral area of the array substrate, so that the scan signal of the sub-pixel of a row is input to the reset signal line 32 of the sub-pixel of a next row in the peripheral area. This structure can avoid cross static electricity between the initialization signal line 51, the reset signal line 32 and the scan line 31, and also avoid the situation where the initialization signal is prone to be affected by the scan signal jump due to the close distance between the initialization signal line 51 and the scan line 31. Under this structure, compared with the structure shown in FIG. 5, the wiring method of this embodiment will occupy more area, thus this embodiment is suitable for a panel with a relatively low PPI, for example, a panel with a PPI less than 410.

Figure 26:
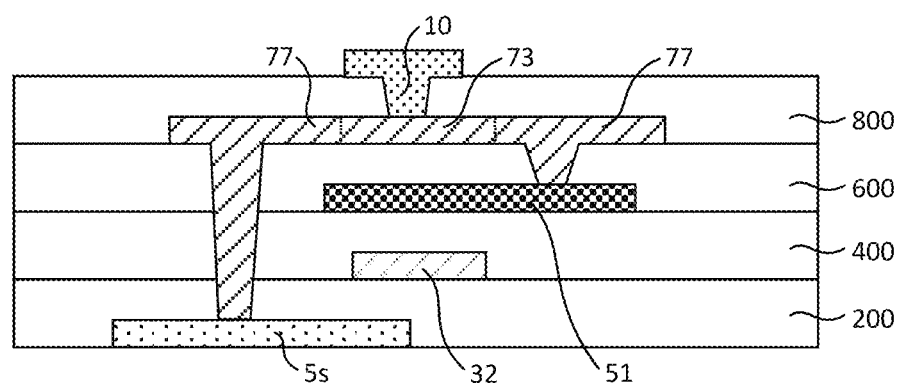
FIG. 26 is a cross-sectional view taken along a direction B-B in FIG. 25.

In this embodiment, the wiring of the source and drain layer 700 is the same as that in the previous embodiment, that is, the source and drain layer 700 includes first to fifth conductive connection portions. Similarly, in this embodiment, the connection lines 10 are provided in the anode layer 900, and the connection lines 10 are connected to the initialization signal lines 51 through the fifth conductive connection portions 77. The shape in which a first conductive connection portion 73 and a fifth conductive connection portion 77 are connected integrally includes, but is not limited to, the T shape shown in FIG. 25. FIG. 26 shows the cross-sectional view of the first conductive connection portion 73 and the fifth conductive connection portion 77 taken along the direction B-B in FIG. 25. When the via holes are provided, the plurality of via holes are staggered from each other in the thickness direction.

Figure 28:
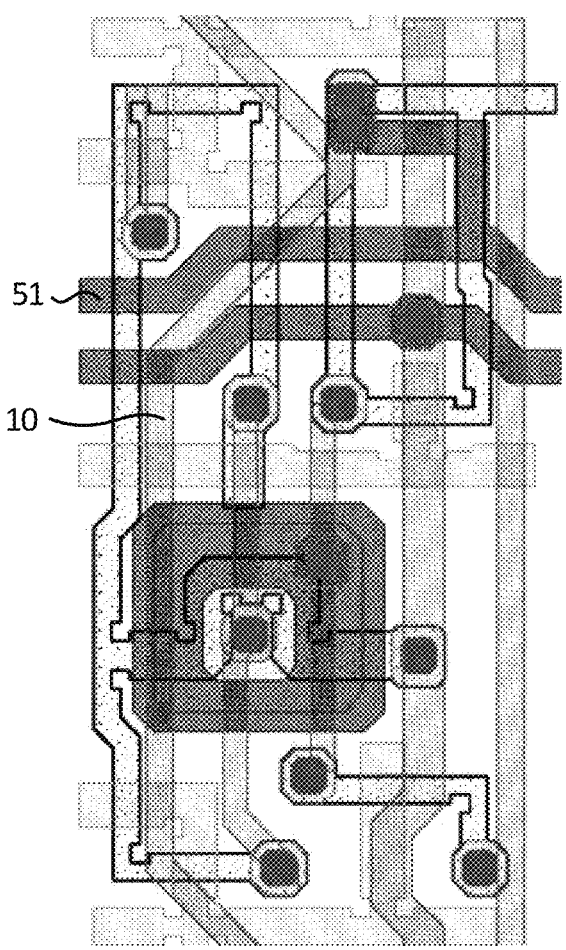
FIG. 28 is a film layer stack structure of a sub-pixel in FIG. 27.
Figure 29:
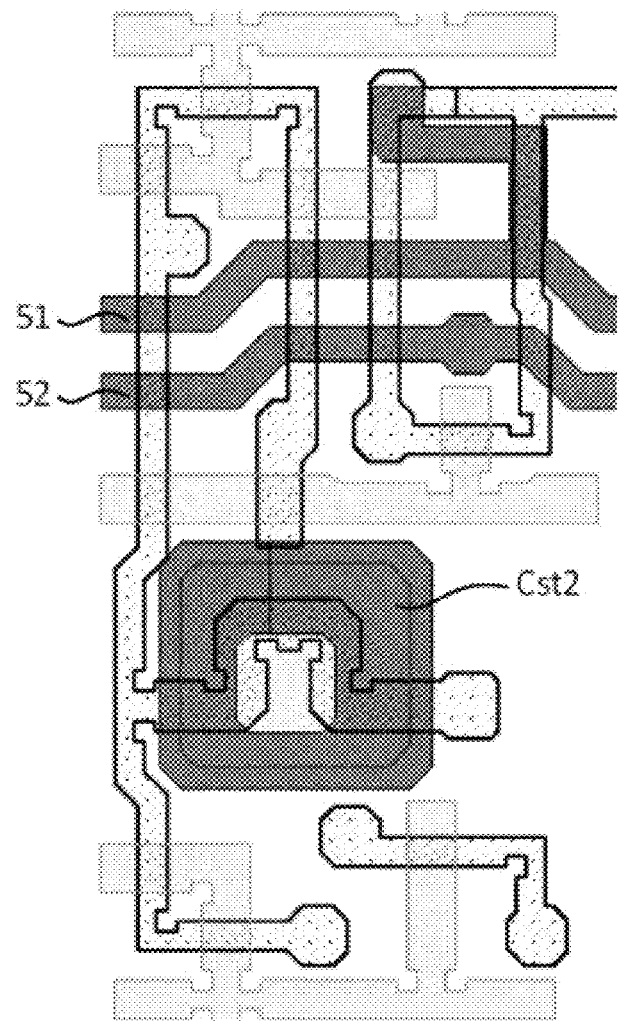
FIG. 29 is a schematic diagram showing stacking of the active layer and the first gate line layer in FIG. 27.
Figure 30:
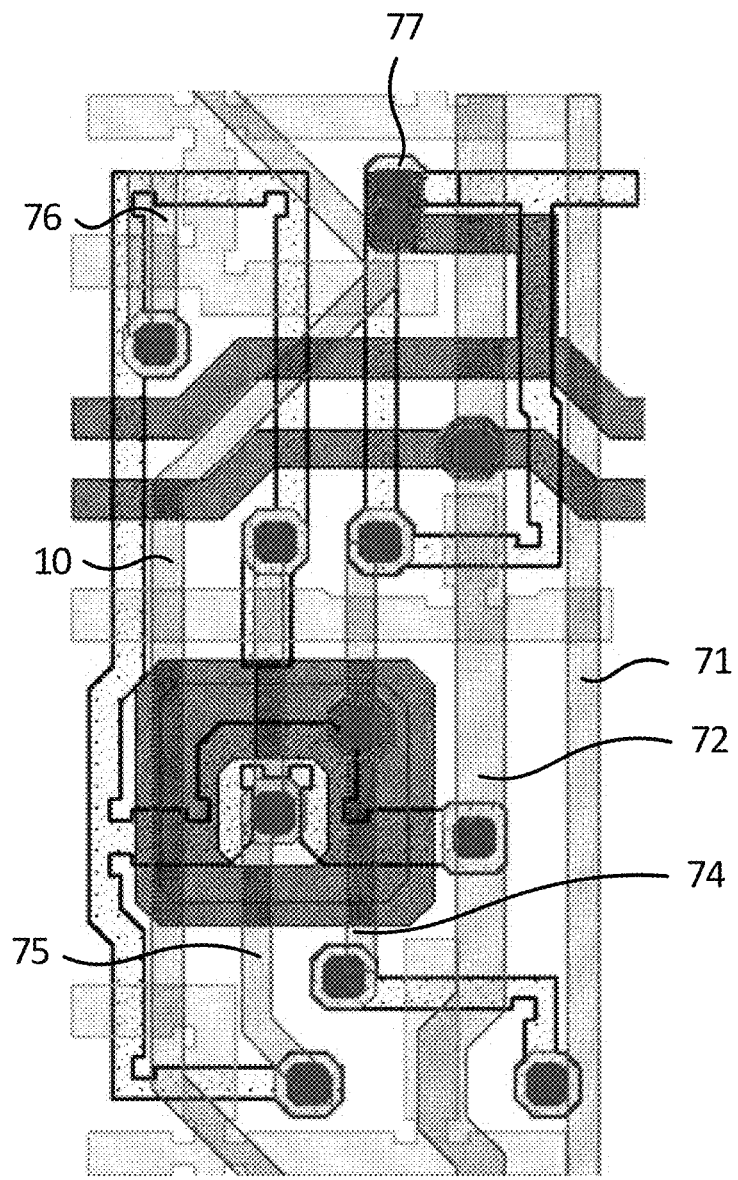
FIG. 30 is a schematic diagram showing stacking of the active layer, the first gate line layer, the second gate line layer, and the source and drain layer in FIG. 27.
Figure 31:
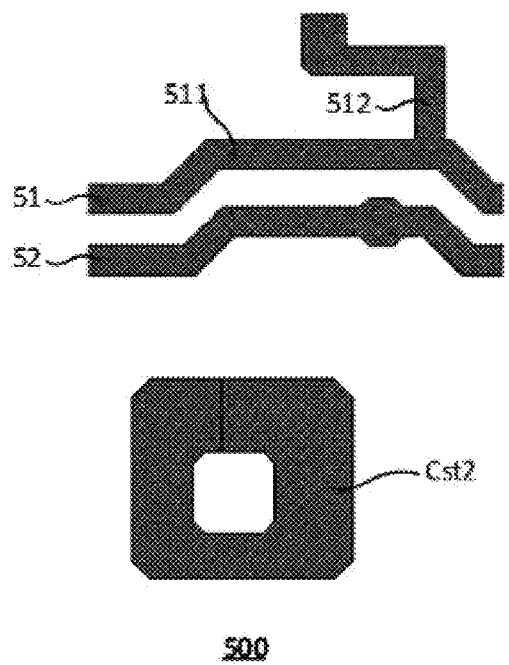
FIG. 31 is a schematic structural diagram of the second gate line layer in FIG. 27.
Figure 32:
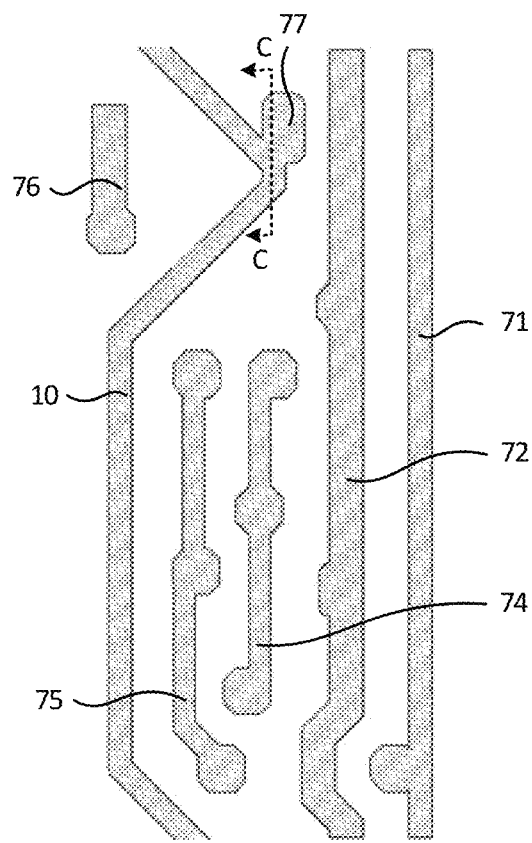
FIG. 32 is a schematic structural diagram of the source and drain layer in FIG. 27.

FIG. 27 shows a schematic structural diagram of an arrangement of a plurality of sub-pixel arrays in another embodiment. FIG. 28 is a stacked structure of a sub-pixel driving circuit of one sub-pixel and various signal lines on the array substrate. FIGS. 29 to 30 show schematic diagrams of film stacking of the second gate line layer 500 and the source and drain layer 700. FIGS. 31 to 32 are schematic diagrams showing the layer structures of the second gate line layer 500 and the source and drain layer 700. The structures of the active layer 100 and the first gate layer 300 are the same as those in FIG. 6 and FIG. 7, and thus related drawings are omitted here.

Referring to FIGS. 29 and 31, different from the previous embodiments, each initialization signal line 51 further includes a main body section 511 and an extension section 512. The main body section 511 of the initialization signal line 51 extends along the row direction, and the projection of the main body section 511 is located on a side of the reset signal line 32 away from the scan line 31 of the previous stage, and on a side of the power lead 52 close to the sub-pixel of the previous stage. The extension section 512 of the initialization signal line 51 bypasses the reset signal line 32 and extends to a position between the reset signal line 32 and the scan line 31 of the previous stage. This structure can avoid the cross static electricity generated between the initialization signal line 51, and the reset signal line 32 and the scan line 31, and is also convenient for the connection with the connection line 10.

Figure 33:
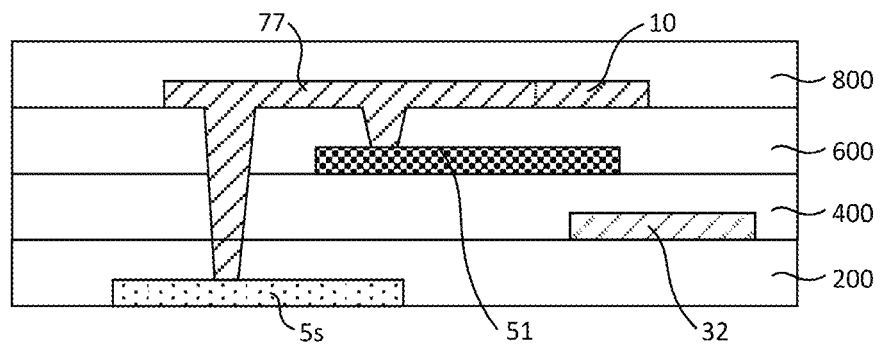
FIG. 33 is a cross-sectional view taken along a direction C-C in FIG. 32.

Referring to FIG. 30 and FIG. 32, different from the previous embodiments, the connection lines 10 are provided in the source and drain layer 700. As shown in the figure, in a sub-pixel area, the connection line 10 is located on a side of the power line 72 away from the data line 71, for example, may be located on a side of the second conductive connection portion 74 and the third conductive connection portion 75 away from the power line 72. The connection line 10 extends along the column direction as a whole, and some part of the connection line 10 is bent to the right to avoid the fourth conductive connection portion 76. Since the connection line 10 does not need to be connected to the anode layer 900, the first conductive connection portion 73 is not included. Specifically, FIG. 33 shows the cross-sectional view of the connection line 10 and a part of the fifth conductive connection portion 77. The figure is a cross-sectional view taken along the direction C-C in FIG. 32. The connection line 10 may be connected to the fifth conductive connection portion 77 integrally, and connected with the initialization signal line 51 through the fifth conductive connection portion. This structure can avoid other circuit structures, realize cross-layer connection and simplify the connection structure. Compared with the structures shown in FIG. 5 and FIG. 17, this structure occupies more area for wiring in the source and drain layer 700, and thus this structure is suitable for panels with lower PPI, such as panels with PPI less than 385. However, since the source and drain layer 700 is etched by a dry etching method, compared with a method in which the anode layer 900 is etched by wet etching, the risk of defects in etching the material of the anode 91 can be reduced. In addition, the material of the source and drain layer 700 has lower resistance than the material of the anode layer 900, which is beneficial to improve the IR drop.

In this embodiment, the wiring arrangement of other lines in the source and drain layer 700 is the same as that in the previous embodiments. Another difference between this embodiment and the structures shown in FIG. 5 and FIG. 17 is that the number of connection lines 10 is equal to the number of sub-pixels in the row direction. That is, in each sub-pixel, an initialization signal line 51 intersects with a connection line 10, and the initialization signal line 51 is connected with the connection line 10 through a vial hole. That is, all sub-pixels have the same internal structure.

The above embodiments provide various arrangement positions and connection methods of the initialization signal lines and connection lines. Various structures according to embodiments of the present disclosure can take into account the PPI requirements and performance requirements of different products while making reasonable wiring. It can be understood that the arrangement positions and connection manners of the initialization signal lines and the connection lines can be combined arbitrarily, so as to meet the PPI requirements of display panels, process practicability and display performance. In addition, the above embodiments are described by taking the pixel circuit structure of 9T1C as an example. When the array substrate adopts other pixel circuit structures, the initialization signal lines and the connection lines can also be connected cross layers in a grid shape, which can also reduce IR drop and at the same time relieve wiring pressure. In addition, the above embodiments are described by taking a situation where each of the above pixel units is composed of four sub-pixels of RGBG and only one algorithm is used as an example. The structures in which the initialization signal lines and the connection lines are connected cross layers and connected as a grid shape can also be applied to other RGBG pixel structure which is arranged using other algorithm. Further, when the pixel unit adopts other arrangement methods, such as RGB, RGBW, etc., the initialization signal lines and the connection lines can also be connected cross layers in a grid shape, which can also reduce the IR drop and relieve the wiring pressure.

An embodiment of the present disclosure further provides a display device including the array substrate according to the above-mentioned embodiments. Since the display device includes the above-mentioned array substrate, the display device has the same beneficial effects, and details are not described here.

The present disclosure does not specifically limit the application of display devices, which can be TVs, notebook computers, tablet computers, wearable display devices, mobile phones, in-vehicle displays, navigation devices, e-books, digital photo frames, advertising light boxes, or other products or parts having a flexible display function.

Other embodiments of the present disclosure will become apparent to those skilled in the art upon consideration of the specification and practice of the disclosure. The present disclosure is intended to cover any variations, uses, or adaptations of the present disclosure that follow the general principles of the present disclosure and include common knowledge or techniques in the technical field not disclosed by the present disclosure. The description and examples are to be regarded as exemplary only, and the true scope and spirit of the present disclosure are defined by the appended claims.

What is claimed is:

1. An array substrate comprising a plurality of pixel units arranged in an array, each of the pixel units comprising a plurality of sub-pixels, wherein the array substrate comprises:
   a plurality of initialization signal lines which are arranged in a conductive layer on a base substrate, extend along a first direction and are arranged at intervals along a second direction, and are used to provide initialization signals to the sub-pixels, wherein the first direction intersects with the second direction; and
   a plurality of connection lines which are arranged in another conductive layer on the base substrate, extend along the second direction and are arranged at intervals along the first direction;
   wherein projections of at least one of the initialization signal lines and at least one of the connection lines on the base substrate intersect, and the at least one of the initialization signal lines and the at least one of the connection lines are connected through a via hole, so that the projections of the initialization signal lines and the connection lines on the substrate form a grid-like structure;
   wherein the array substrate further comprises: a plurality of power lines, wherein the plurality of power lines and the plurality of connection lines are arranged in a same layer, the plurality of power lines are arranged at intervals along the first direction and extend along the second direction, and are used for providing power signals to the sub-pixels;

wherein one of the connection lines and one of the power lines in a same column both extend along the second direction and are arranged in sequence along the first direction and orthographic projections of the one of the connection lines and one of the power lines in the same column on the base substrate do not overlap with each other.

2. The array substrate according to claim 1, wherein:

the array substrate comprises the base substrate and a first gate line layer, a second gate line layer, a source and drain layer and an anode layer which are stacked on the base substrate in sequence, the first direction is a row direction, and the second direction is a column direction;

the plurality of initialization signal lines are arranged in the second gate line layer; and the plurality of connection lines are arranged in the source and drain layer.

3. The array substrate according to claim 2, wherein one of the plurality of connection lines extends along the column direction as a whole, and a part of the one of the connection lines is bent to the right.

4. The array substrate according to claim 2, further comprises:

a plurality of scan lines which are arranged in the first gate line layer, extend along the row direction and are arranged at intervals along the column direction, and are used providing scan signals to the sub-pixels; and a plurality of reset signal lines which are arranged in the first gate line layer, extend along the row direction and are arranged at intervals along the column direction, and are used for providing reset signals to the sub-pixels.

5. The array substrate according to claim 4, wherein in each sub-pixel area, a projection of a corresponding initialization signal line among the plurality of initialization signal lines on the base substrate is located between a projection of a corresponding reset signal line among the plurality of the plurality of reset signal lines and a projection of a scan line for a previous-stage sub-pixel, and the projection of the corresponding initialization signal line, the projection of the corresponding reset signal line and the projection of the scan line do not overlap with each other.

6. The array substrate according to claim 1, wherein the number of the connection lines is equal to the number of sub-pixels in the row direction, and in the row direction, the initialization signal lines and the connection lines are electrically connected through via holes in individual sub-pixel areas;

or, the number of the connection lines is smaller than the number of sub-pixels in the row direction, and in the row direction, the initialization signal lines and the connection lines are electrically connected through via holes in a part of sub-pixel areas.

7. The array substrate according to claim 1, wherein the array substrate further comprises:

a plurality of power leads which are arranged in another conductive layer, are arranged at intervals along the second direction and extend along the first direction;

wherein projections of at least one of the power lines and at least one of the power leads on the base substrate intersect, and the at least one of the power lines and the at least one of the power leads are connected through a via hole, and projections of the power lines and the power leads on the base substrate form a grid-like structure.

8. The array substrate according to claim 7, wherein one of the initialization lines and one of the power leads in a same row extend along the first direction and are arranged along the second direction, and orthographic projections of the one of the initialization lines and one of the power leads in the same row on the base substrate do not overlap with each other.

9. The array substrate according to claim 7, wherein the array substrate comprises the base substrate and a first gate line layer, a second gate line layer, a source and drain layer and an anode layer which are stacked on the base substrate in sequence, where in the plurality of power lines are arranged in the source and drain layer, extend along the second direction and arranged at intervals along the first direction, and are used for providing power signals to the sub-pixels.

10. The array substrate according to claim 7, wherein the array substrate comprises the base substrate and a first gate line layer, a second gate line layer, a source and drain layer and an anode layer which are stacked on the base substrate in sequence;

wherein the plurality of initialization signal lines are arranged in the second gate line layer, extend along the first direction and are arranged at intervals along the second direction, and are used to provide initialization signals to the sub-pixels;

wherein each of the sub-pixels comprises a sub-pixel driving circuit, and the sub-pixel driving circuit comprises a capacitor comprising a first electrode plate and a second electrode plate, the first electrode plate is arranged in the first gate line layer, and the second electrode plate is arranged in the second gate line layer;

wherein a projection of each of the power leads on the base substrate is located between a projection of a corresponding initialization signal line among the plurality of initialization signal lines on the base substrate and a projection of the second electrode plate on the base substrate.

11. The array substrate according to claim 7, wherein the array substrate further comprises:

a plurality of data lines which are arranged in a source and drain layer, extend along the second direction and are arranged at intervals along the first direction, and are used for providing data signals to the sub-pixels.

12. The array substrate according to claim 1, wherein:

the connection lines are arranged in a source and drain layer;

in each sub-pixel area, a corresponding initialization signal line of the plurality of initialization signal lines comprises a main body section and an extension section which are connected to each other, the main body section of the corresponding initialization signal line extends along the row direction, and the extension section of the corresponding initialization signal line extends in a direction different from an extending direction of the main body section; and a projection of the extension section of the corresponding initialization signal line on the base substrate overlaps with a projection of a corresponding connection line among the plurality of connection lines, and the extension section of the corresponding initialization signal line and the corresponding connection line are connected through a via hole in the overlapping area.

13. The array substrate according to claim 4, further comprising:
a plurality of light-emitting control signal lines which are arranged in the first gate line layer, extend along the row direction and arranged at intervals along the column direction, and are used for providing light-emitting control signals to the sub-pixels;
wherein in each sub-pixel area, a corresponding light-emitting control signal line among the plurality of light-emitting control signals is located on a side of a corresponding reset signal line away from a scan line for a previous-stage sub-pixel, and does not overlap with a projection of a corresponding initialization signal line.

14. The array substrate according to claim 9, further comprising:
a plurality of power leads which are arranged in the second gate line layer, extend along the row direction and are arranged at intervals along the column direction, and power lines in a same row are connected to one of the power leads through via holes.

15. The array substrate according to claim 13, wherein each of the sub-pixels further comprises a sub-pixel driving circuit, and the sub-pixel driving circuit comprises:
a capacitor comprising a first electrode plate and a second electrode plate, wherein the first electrode plate is arranged in the first gate line layer, and the second electrode plate is arranged in the second gate line layer;
a driving transistor, wherein the first electrode plate of the capacitor is multiplexed as a gate of the driving transistor;
a second transistor, wherein a gate of the second transistor is connected to the corresponding scan line, a first electrode of the second transistor is connected to a second electrode of the driving transistor, and a second electrode of the second transistor is connected to the first electrode plate of the capacitor;
wherein the array substrate further comprises an active layer below the first gate line layer, active areas of the driving transistor and the second transistor are arranged in the active layer;
wherein the gate of the second transistor is arranged in the first gate line layer.

16. The array substrate according to claim 15, wherein the sub-pixel driving circuit further comprises:
a seventh transistor, wherein a gate of the seventh transistor is connected to the corresponding light-emitting control signal line, a first electrode of the seventh transistor is electrically connected to the second electrode of the driving transistor, and a second electrode of the seventh transistor is electrically connected to the anode of the sub-pixel; and
an eighth transistor, wherein a gate of the eighth transistor is connected to the corresponding reset signal line, a first electrode of the eighth transistor is electrically connected to the corresponding initialization signal line, and a second electrode of the eighth transistor is electrically connected to the anode of the sub-pixel; and
wherein active areas of the seventh transistor and the eighth transistor are arranged in the active layer, the gate of the seventh transistor and the gate of the eighth transistor are arranged in the first gate line layer.

17. The array substrate according to claim 16, wherein the sub-pixel driving circuit further comprises:

a ninth transistor, wherein a gate of the ninth transistor is connected to the corresponding light-emitting control signal line, and a first electrode of the ninth transistor is electrically connected to the first electrode plate of the capacitor.

18. The array substrate according to claim 17, wherein the array substrate further comprises:
a plurality of first conductive connection portions which are arranged in the source and drain layer, and are distributed in sub-pixel areas where projections of the initialization signal lines and the connection lines intersect;
wherein in a sub-pixel area where a first conductive connection portion among the plurality of first conductive connection portions is distributed, a projection of the first conductive connection portion on the base substrate has an overlapping area with a corresponding initialization signal line and a corresponding connection line, respectively, and the first conductive connection portion is connected to the corresponding connection line through a via hole.

19. A display device, comprising an array substrate; wherein the array substrate comprises a plurality of pixel units arranged in an array, each of the pixel units comprising a plurality of sub-pixels, wherein the array substrate comprises: a plurality of initialization signal lines which are arranged in a conductive layer on a base substrate, extend along a first direction and are arranged at intervals along a second direction, and are used to provide initialization signals to the sub-pixels, wherein the first direction intersects with the second direction; and a plurality of connection lines which are arranged in another conductive layer on the base substrate, extend along the second direction and are arranged at intervals along the first direction; wherein projections of at least one of the initialization signal lines and at least one of the connection lines on the base substrate intersect, and the at least one of the initialization signal lines and the at least one of the connection lines are connected through a via hole, so that the projections of the initialization signal lines and the connection lines on the substrate form a grid-like structure; wherein the array substrate further comprises: a plurality of power lines, wherein the plurality of power lines and the plurality of connection lines are arranged in a same layer, the plurality of power lines are arranged at intervals along the first direction and extend along the second direction, and are used for providing power signals to the sub-pixels; wherein one of the connection lines and one of the power lines in a same column both extend along the second direction and are arranged in sequence along the first direction and orthographic projections of the one of the connection lines and one of the power lines in the same column on the base substrate do not overlap with each other.

20. The display device according to claim 19, wherein:
the array substrate comprises the base substrate and a first gate line layer, a second gate line layer, a source and drain layer and an anode layer which are stacked on the base substrate in sequence, the first direction is a row direction, and the second direction is a column direction;
the plurality of initialization signal lines are arranged in the second gate layer; and
the plurality of connection lines are arranged in the source and drain layer or the anode layer.

* * * * *